United States Patent
Beidas et al.

(10) Patent No.: US 9,614,554 B2
(45) Date of Patent: Apr. 4, 2017

(54) MULTICARRIER SUCCESSIVE PREDISTORTION FOR DIGITAL TRANSMISSION

(71) Applicant: Hughes Network Systems, LLC, Germantown, MD (US)

(72) Inventors: Bassel Beidas, Alexandria, VA (US); Rohit Iyer Seshadri, Gaithersburg, MD (US); Neal Becker, Frederick, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/738,812

(22) Filed: Jun. 12, 2015

(65) Prior Publication Data
US 2015/0311927 A1 Oct. 29, 2015

Related U.S. Application Data

(63) Continuation-in-part of application No. 14/675,735, filed on Mar. 31, 2015.
(Continued)

(51) Int. Cl.
*H04K 1/02* (2006.01)
*H04B 1/04* (2006.01)
(Continued)

(52) U.S. Cl.
CPC ............ *H04B 1/0475* (2013.01); *H04B 7/15* (2013.01); *H04L 25/03343* (2013.01); *H04L 27/368* (2013.01); *H04B 2001/0425* (2013.01)

(58) Field of Classification Search
CPC .. H03F 1/3247; H03F 2201/3233; H03F 3/24; H03F 1/3241; H03F 2201/3224;
(Continued)

(56) References Cited

U.S. PATENT DOCUMENTS

| 2011/0103507 | A1* | 5/2011 | Beidas | ............... H04L 27/0008 375/285 |
|---|---|---|---|---|
| 2014/0079160 | A1 | 3/2014 | Beidas et al. | |
| 2015/0010118 | A1 | 1/2015 | Beidas et al. | |

OTHER PUBLICATIONS

US Patent Office, "International Search Report and Written Opinion", PCT/US2015/035707, Sep. 18, 2015.

* cited by examiner

*Primary Examiner* — Rahel Guarino
(74) *Attorney, Agent, or Firm* — Potomac Technology Law, LLC

(57) ABSTRACT

An approach for improved compensation for nonlinear distortion in multicarrier satellite systems is provided. Source reflecting encoded and modulated sequences of source data symbols are received. Each source signal is predistorted, and a transmit filter is applied to each predistorted source signal. Each filtered signal is translated to a carrier frequency, and the translated signals are combined into a composite signal for transmission via a multicarrier transponder. The final predistorted version of each source signal is generated via an iterative process of a number of stages, wherein, for a given stage and for each source signal, the process comprises: receiving a prior predistorted version of each source signal from a preceding stage; processing each prior predistorted source signal based on all of the received prior predistorted source signals, wherein the processing is performed based on a characterization of one or more characteristics of the multicarrier satellite transponder.

22 Claims, 15 Drawing Sheets

Related U.S. Application Data

(60) Provisional application No. 61/973,227, filed on Mar. 31, 2014, provisional application No. 62/011,567, filed on Jun. 12, 2014.

(51) Int. Cl.
*H04B 7/15* (2006.01)
*H04L 25/03* (2006.01)
*H04L 27/36* (2006.01)

(58) Field of Classification Search
CPC ...... H04B 1/62; H04B 10/58; H04B 10/5051; H04B 17/101; H04B 1/04; H04B 7/15; H04L 27/368; H04L 25/03343; H04L 2025/03414; H04L 27/367; H04L 2025/03426; H04L 27/0002; H04L 27/04; H04L 27/12
USPC ............... 375/296, 297, 260, 285, 298, 261; 455/114.3, 63.1, 91, 102; 327/317
See application file for complete search history.

MULTICARRIER SUCCESSIVE PREDISTORTION FOR DIGITAL TRANSMISSION

RELATED APPLICATIONS

This application is a continuation in part, under 35 U.S.C. §120, from of U.S. patent application Ser. No. 14/675,735 (filed Mar. 31, 2015), which claims the benefit of the earlier filing date under 35 U.S.C. §119(e) of U.S. Provisional Application Ser. No. 61/973,227 (filed Mar. 31, 2014); and this application claims the benefit of the earlier filing date under 35 U.S.C. §119(e) of U.S. Provisional Application Ser. No. 61/011,567 (filed Jun. 12, 2014).

BACKGROUND

Satellite communication systems must transmit signals vast distances from earth to satellites in orbit and vice versa. Additionally, satellites have strict power consumption limits that require the communication systems to operate at very high efficiencies of both power use and usage of available communication bandwidth. Many satellites use high power amplifiers (HPAs) for communication purposes. Typically, HPAs operate most efficiently at (or near) saturation. Unfortunately, operation of HPAs at (or near) saturation can lead to inter-symbol interference (ISI) in output channels. The output of a transmitter can be seen as a sequence of symbols called a phrase. Each symbol represents a sequence of bits, in the case of 8PSK, each symbol represents 3 bits. A transmitter will output the phrase one symbol at a time during transmission. As a transmitter shifts from one symbol to the next in the phrase, previous and future output symbols may cause interference in the output of the current symbol. This interference in the current symbol caused by past and future symbols is ISI.

In current satellite communications systems, the uplinked signal is amplified and channelized in a transparent satellite transponder. Further, to satisfy the aggressive demand for higher satellite throughput, industry trend is moving towards sharing the transponder amplifier by multiple carriers, each employing high-order modulations that are spectrally compact. Joint amplification of multiple-carrier signals using a common HPA is also employed to meet satellite power and mass requirements. Given the inherently nonlinear nature of the amplifier when driven efficiently closer to saturation, however, the amplification of multiple carriers through a common HPA further exacerbates the issue of intermodulation distortion that needs to be appropriately compensated. The non-linear effects are even more prominent in this scenario due to onset of such intermodulation products causing adjacent channel interference (ACI). A significant guard-band between the carriers may be needed in order to avoid ACI, thereby reducing spectral efficiency. Additionally, use of multiple carriers leads to high peak to average power ratios, which increases the back-off leading an amplification efficiency loss. Moreover, on-board channelization filters (IMUX/OMUX) introduce inter-symbol interference (ISI), which further degrades the performance. In order to mitigate the nonlinear distortion, significant back off is required, leading to power efficiency loss.

Improved technological solutions are needed to satisfy the aggressive demand for satellite throughput in broadband and broadcasting applications. The key is to maximize system efficiency at many levels, such as payload mass efficiency through sharing each satellite HPA (i.e., travelling-wave tube amplifier (TWTA)) by multiple carriers, bandwidth efficiency by employing frequency-compact carriers with high-order modulations using Amplitude and Phase Shift Keying (APSK) that are tightly packed in the spectrum, and power efficiency by properly operating the TWTA close to saturation. Due to the inherently nonlinear nature of TWTAs, this creates an environment with substantial non-linear distortion that is significantly detrimental to system performance if left uncompensated.

Towards the goal of mitigating the nonlinear distortion, the articles (1) B. F. Beidas and R. I. Seshadri, "Analysis and compensation for nonlinear interference of two high-order modulation carriers over satellite link," IEEE Trans. Comm., vol. 58, no. 6, pp. 1824-1833, June 2010, and (2) B. F. Beidas, "Intermodulation distortion in multicarrier satellite systems: Analysis and turbo volterra equalization," IEEE Trans. Comm., vol. 59, no. 6, pp. 1580-1590, June 2011 provide an analytical framework that characterizes intermodulation distortion (IMD) resulting from such scenarios. The article (2) investigates receiver algorithms based on Turbo Volterra processing, where soft information between decoders and multicarrier Volterra equalizer is exchanged to progressively improve performance. Further, the articles (3) X. Wang and H. V. Poor, "Iterative (Turbo) soft interference cancellation and decoding for coded CDMA," IEEE Trans. Comm., vol. 47, no. 7, pp. 1046-1061, July 1999, (4) H. El-Gamal and E. Geraniotis, "Iterative multiuser detection for coded CDMA in AWGN and fading channels," IEEE J. Select. Areas Comm., vol. 18, no. 1, pp. 30-41, January 2000, and (5) B. F. Beidas, H. El-Gamal, and S. Kay, "Iterative interference cancellation for high spectral efficiency satellite communications," IEEE Trans. Comm., vol. 50, no. 1, pp. 31-36, January 2002 discuss the technology of multi-user detection (MUD) in nonlinear systems.

According to other current approaches, the articles (7) G. Karam and H. Sari, "Analysis of predistortion, equalization, and ISI cancellation techniques in digital radio systems with nonlinear transmit amplifiers," IEEE Trans. Comm., vol. 37, no. 12, pp. 1245-1253, December 1989, (8) L. Giugno, M. Luise, and V. Lottici, "Adaptive pre- and post-compensation of nonlinear distortions for high-level data modulations," IEEE Trans. Wireless Comm., vol. 3, no. 5, pp. 1490-1495, September 2004, and (9) R. De Gaudenzi, A. G. Fabregas, and A. Martinezi, "Performance analysis of turbo-coded APSK modulations over nonlinear satellite channels," IEEE Trans. Wireless Comm., vol. 5, no. 9, pp. 2396-2407, September 2006 discuss static or memoryless data predistortion techniques that simplify attempts to correct for the constellation warping, without mitigating the nonlinear intersymbol interference (ISI). Also, the article (10) E. Biglieri, S. Barberis, and M. Catena, "Analysis and compensation of nonlinearities in digital transmission systems," IEEE J. Select. Areas Comm., vol. 6, no. 1, pp. 42-51, January 1988 proposes compensation based on $p^{th}$ order Volterra inverse of the nonlinearity, and article (11) C. Eun and E. Powers, "A new volterra predistorter based on the indirect learning architecture," IEEE Trans. Signal Process., vol. 45, no. 1, pp. 223-227, January 1997 introduces an adaptive version of the Volterra inverse. Further, predistortion based on nonlinear polynomial models is investigated in article (12) L. Ding, G. Zhou, D. Morgan, M. Zhengxiang, J. Kenney, K. Jaehyeong, and C. Giardina, "A robust digital baseband predistorter constructed using memory polynomials," IEEE Trans. Comm., vol. 52, no. 1, pp. 159-165, January 2004. Dynamic data predistortion (based on look-up tables), generated by minimizing mean-squared error (MSE), is investigated in the articles (13) G. Karam and H. Sari, "A data predistortion technique with memory for QAM radio systems," IEEE Trans. Comm., vol. 39, no. 2, pp. 336-344, February 1991, and (14) E. Casini, R. De Gaudenzi, and A. Ginesi, "DVB-S2 modem algorithms design and performance over typical satellite channels," Int'l J. on Satellite Comm. and Networking, vol. 22, no. 2, pp. 281-318, 2004—however, the size of LUTs grows exponentially with the modulation order and the memory span of the channel, both of which are large in efficient satellite systems. To avoid the use of LUTs, successive application of distortion cancellation is proposed in U.S. Pat. No. 8,355,462, "System and method for combined predistortion and interference cancellation in a satellite communications system." With respect to multicarrier systems (where multiple carriers share the same nonlinearity), article (16) R. Piazza, M. R. Bhavani Shankar, E. Zenteno, D. Ronnow, J. Grotz, F. Zimmer, M. Grasslin, F. Heckmann, and S. Cioni, "Multicarrier digital predistortion/equalization techniques for non-linear satellite channels," Proc. 30th AIAA Int'l Comm. Satellite System Conference (ICSSC), September 2012 proposes a multicarrier PD is proposed, which is based on modifying the transmitted symbols by a 3rd-order Volterra inverse of the nonlinearity and simplified using the memory polynomial approach of Reference (12). Avoiding the use of LUTs is particularly important in the multicarrier case as the size of LUTs grows exponentially not only with modulation order and memory span of the channel but also with the number of carriers.

As bandwidth demands continue to increase, system requirements are driven to new levels, such as requirements for further increased satellite throughput, improved spectral efficiency, further satellite power and mass optimization and further improved decoding capabilities of system terminal receivers (without driving the receiver complexity and processing burdens to inefficient and impractical levels). What is needed, therefore, are approaches that provide improved compensation for mitigating nonlinear distortion in such high throughput multicarrier satellite communications systems (employing HPAs that process composite multicarrier signals for transmission over respective satellite channels, where the HPAs operate at or near saturation), which can be deployed entirely at the transmitter or gateway.

BRIEF SUMMARY

The present invention advantageously addresses the foregoing requirements and needs, as well as others, by providing approaches for improved compensation for mitigating nonlinear distortion in such high throughput multicarrier satellite communications systems (employing HPAs that process composite multicarrier signals for transmission over respective satellite channels, where the HPAs operate at or near saturation), which can be deployed entirely at the transmitter or gateway.

Embodiments of the present invention provide powerful compensation techniques for mitigating the nonlinear distortion, which can be deployed entirely at the transmitter or gateway. By way of example, the transmission symbols are modified such that, upon reception, the received symbols exhibit a minimum amount of IMD-induced clustering. More specifically, embodiments of the present invention provide for a multicarrier data predistortion (PD) technique that comprises estimation of the distortion that would result from passing the transmission signal (reflecting a composite of the signals of each carrier that will share the transmission channel) through the nonlinear satellite channel. The distortion estimate is then used to generate an error signal that is driven to zero by applying the estimation in a successive staged manner. Further, the predistortion is applied by the gateway transmitter, prior to transmission of the carrier signals to the destination receivers. More specifically, the distortion determination is performed based on an estimation of the IMD effects (the inter-relational effects) of all adjacent carriers sharing the common channel (being processed together through the non-linear channel). While the determination takes into account such inter-relational effects of all the carriers, however, the error signal is driven to zero, and the predistortion is applied, for each carrier individually. Further, with the approaches of the present invention, a relatively simple single carrier receiver can be employed at the receiver end to receive the composite signal transmitted by the gateway via the multicarrier satellite channel, and to tune to and demodulate and decode the individual carrier signal destined for the respective terminal. As such, in view of the predistortion applied by the gateway to each individual carrier, the resulting carrier signal received by the destination terminal will already exhibit or reflect compensation for the IMD resulting from the transmission of the composite signal via a single satellite channel.

According to specific embodiments, two methods of estimating the distortion are provided, whereby one is based on explicit implementation and one is based on a multicarrier Volterra approach (e.g., based on a Volterra approach as introduced by the above-referenced articles (1) and (2)). Further, embodiments of the present invention provide improvements over the PD method proposed by U.S. Pat. No. 8,355,462, which is based on successive cancellation of nonlinear distortion in (i.e., in the case of multicarrier systems). Moreover, embodiments of the present invention avoid the use of LUTs. With regard to performance, extensive numerical studies have been conducted to evaluate the performance of the proposed multicarrier PD approaches of such embodiments of the present invention in a variety of scenarios when using high-order spectrally-efficient 16-APSK and 32-APSK modulations that are FEC-encoded with the LDPC codes of the DVB-S2 standard (ETSI EN 302 307). In accordance with such example embodiments, near-optimum performance is achieved (operating the HPAs/TWTAs close to saturation), even with the deployment of a simple linear receiver without exchange of data symbols between receivers.

In accordance with example embodiments a method is provided for improved compensation for mitigating nonlinear distortion in high throughput multicarrier satellite communications systems. A plurality of source signals are received, wherein each source signal reflects an encoded and modulated sequence of source data symbols. A final predistorted version of each source signal is generated, and a transmit filter is applied to the predistorted version of each of the source signals. Each of the filtered signals is then translated to a respective carrier frequency, and the translated signals are combined to generate a composite signal for transmission via a multicarrier satellite transponder. The final predistorted version of each of the source signals is generated via an iterative process of a number of stages, wherein, for a given stage and for each source signal, the process comprises: receiving a respective prior predistorted version of each of the source signals from a preceding stage; processing the prior predistorted version of the source signal based on all of the received prior predistorted versions of the source signals, wherein the processing of the prior predistorted version of the source signal is performed based on a characterization of one or more characteristics of the multicarrier satellite transponder.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF SUMMARY OF THE DRAWINGS

The accompanying drawings, which are incorporated in and form a part of the specification, illustrate an example embodiment of the present invention and, together with the description, serve to explain the principles of the invention. In the drawings.

DETAILED DESCRIPTION

Figure 1:
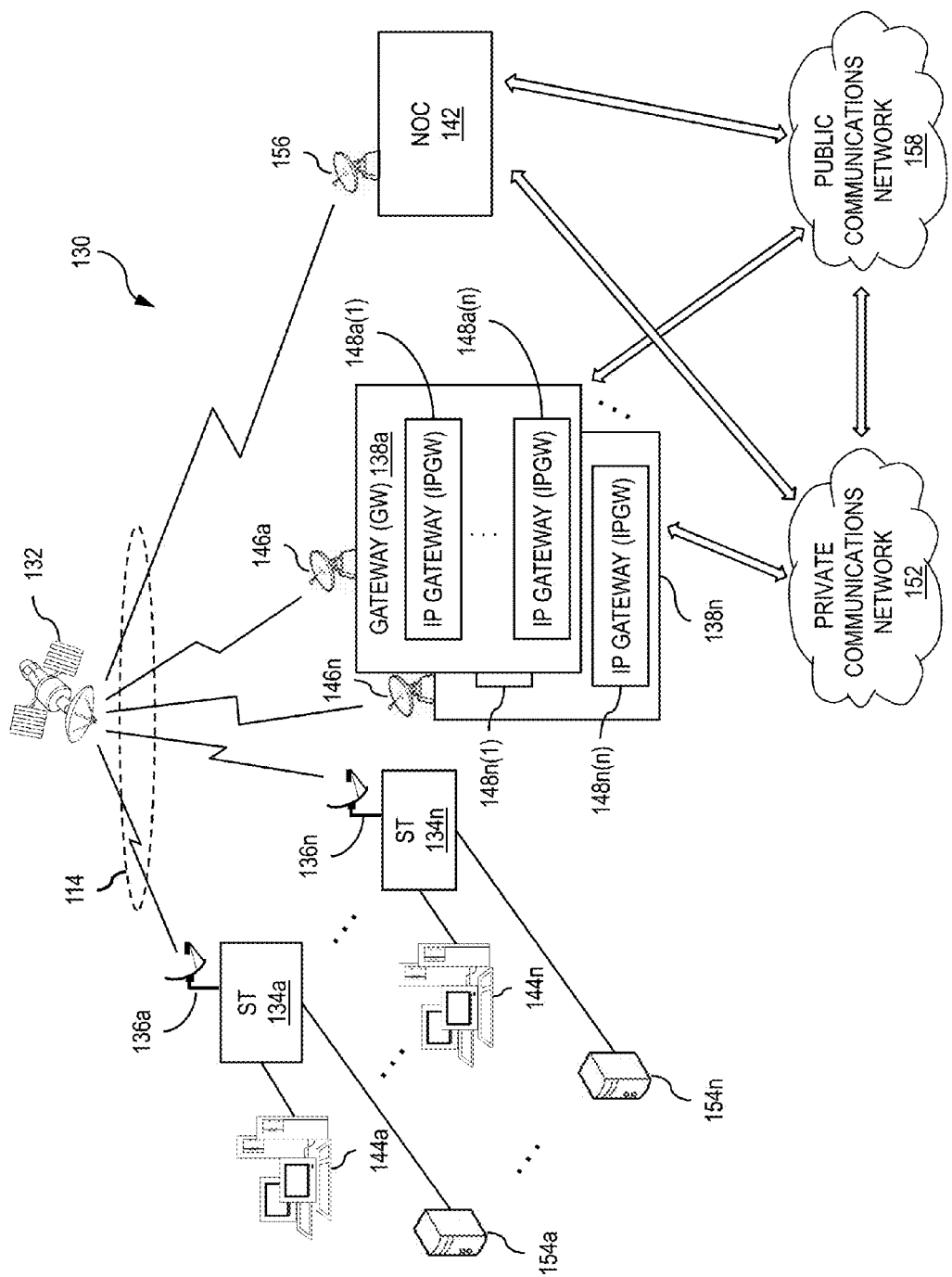
FIG. 1 illustrates a multicarrier satellite communications system for employing predistortion approaches, in accordance with example embodiments.

Approaches that provide improved compensation for mitigating nonlinear distortion in high throughput multicarrier satellite communications systems (employing HPAs that process composite multicarrier signals for transmission over respective satellite channels, where the HPAs operate at or near saturation), which can be deployed entirely at the transmitter or gateway, are described. In the following description, for the purposes of explanation, numerous specific details are set forth in order to provide a thorough understanding of the present invention. The present invention is not intended to be limited based on the described embodiments, and various modifications will be readily apparent. It will be apparent that the invention may be practiced without the specific details of the following description and/or with equivalent arrangements. Additionally, well-known structures and devices may be shown in block diagram form in order to avoid unnecessarily obscuring the invention. Further, the specific applications discussed herein are provided only as representative examples, and the principles described herein may be applied to other embodiments and applications without departing from the general scope of the present invention.

As will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Further, terminology referring to computer-readable media or computer media or the like as used herein refers to any medium that participates in providing instructions to the processor of a computer or processor module or component for execution. Such a medium may take many forms, including but not limited to non-transitory non-volatile media and volatile media. Non-volatile media include, for example, optical disk media, magnetic disk media or electrical disk media (e.g., solid state disk or SDD). Volatile media include dynamic memory, such random access memory or RAM. Common forms of computer-readable media include, for example, floppy or flexible disk, hard disk, magnetic tape, any other magnetic medium, CD ROM, CDRW, DVD, any other optical medium, random access memory (RAM), programmable read only memory (PROM), erasable PROM, flash EPROM, any other memory chip or cartridge, or any other medium from which a computer can read data.

FIG. 1 illustrates an example satellite communications system 130 capable of supporting communications among terminals with varied capabilities, according to example embodiments. Satellite communications system 130 includes a satellite 132 that supports communications among multiple satellite terminals (STs) 134a-134n, a number of gateways (GWs) 138a-138n, and a network operations center (NOC) 142. The STs, GWs and NOC transmit and receive signals via the antennas 136a-136n, 146a-146n, and 156, respectively. According to different embodiments, the NOC 142 may reside at a separate site reachable via a separate satellite channel or may reside within a GW site.

The NOC 142 performs the management plane functions of the system 130, while the GWs 138a-138n perform the data plane functions of the system 130. For example, the NOC 142 performs such functions as network management and configuration, software downloads (e.g., to the STs 134a-134n), status monitoring, statistics functions (e.g., collection, aggregation and reporting), security functions (e.g., key generation, management and distribution), ST registration and authentication, and GW diversity management. The NOC 142 communicates with each GW via the satellite 132, or via a secure private communications network 152 (e.g., an IPsec tunnel over a dedicated link or a virtual private network (VPN) or IPsec tunnel through a public network, such as the Internet). It should be noted that, according to one example embodiment, the traffic classification approaches of embodiments of the present invention address classification of data traffic flowing through an aggregation point or node. Additionally, each GW and the NOC have connectivity to one or more public communications networks, such as the Internet or a PSTN.

According to a further example embodiment, each of the GWs 138a-138n include one or more IP gateways (IP-GWs)—whereby the data plane functions are divided between a GW and its respective IPGWs. For example, GW 138a includes IPGWs 148a(1)-148a(n) and GW 138n includes IPGWs 148n(1)-148n(n). A GW may perform such functions as link layer and physical layer outroute coding and modulation (e.g., DVB-S2 adaptive coding and modulation), link layer and physical layer inroute handling (e.g., IPOS), inroute bandwidth allocation and load balancing, outroute prioritization, web acceleration and HTTP compression, flow control, encryption, redundancy switchovers, and traffic restriction policy enforcement. Whereas, the IPGW may perform such functions as data compression, TCP performance enhancements (e.g., TCP performance enhancing proxies, such as TCP spoofing), quality of service functions (e.g., classification, prioritization, differentiation, random early detection (RED), TCP/UDP flow control), bandwidth usage policing, dynamic load balancing, and routing. Further, a GW and respective IPGW may be co-located with the NOC 142. The STs 134a-134n provide connectivity to one or more hosts 144a-144n and/or routers 154a-154n, respectively. The Satellite communications system 130 may operate as a bent-pipe system, where the satellite essentially operates as a repeater or bent pipe. Alternatively, the system 130 may employ a switching or processing satellite supporting mesh communications (point-to-point communications directly between, for example, the two STs 134a and 134n).

Figure 2:
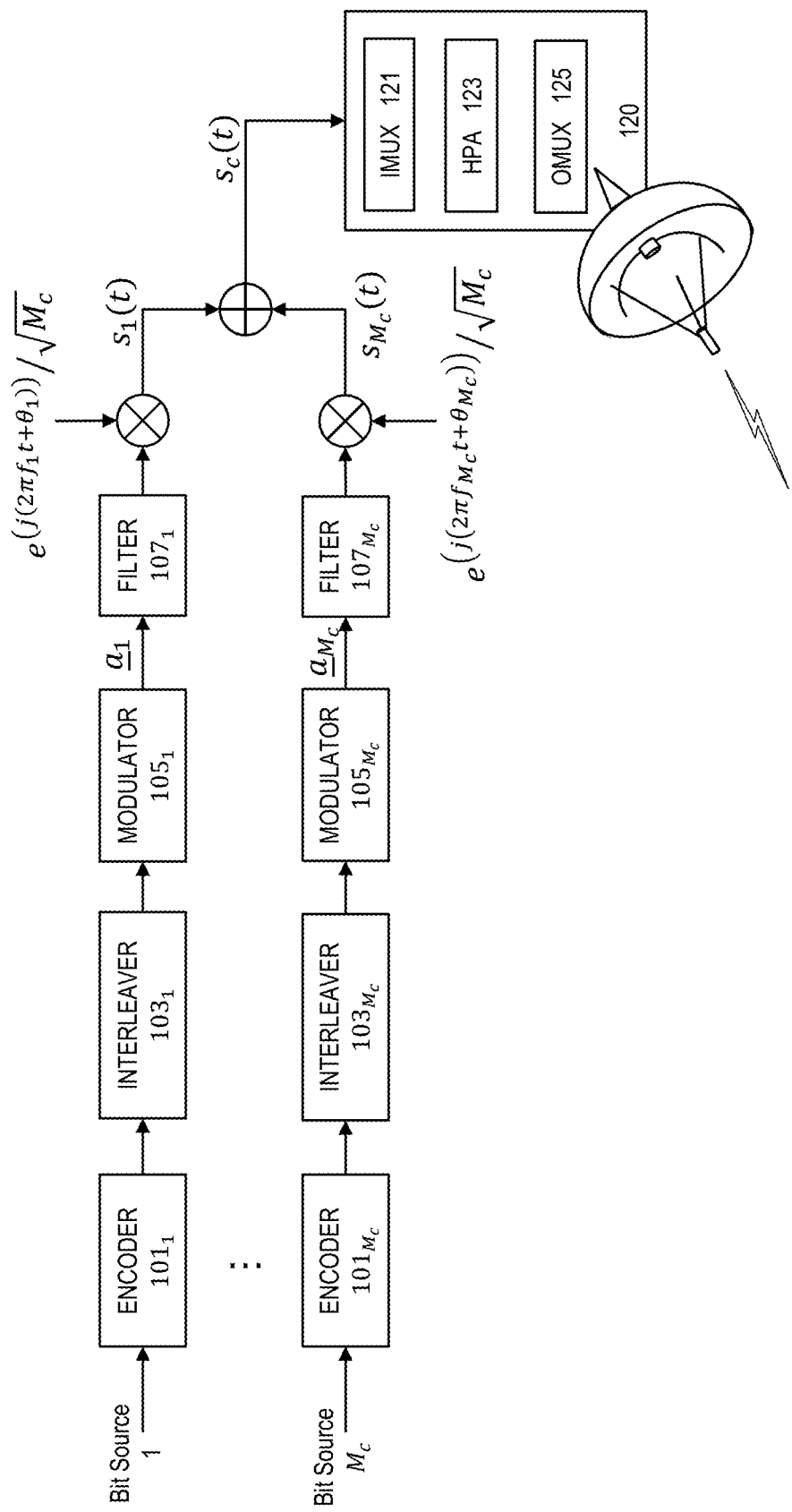
FIG. 2 illustrates a block diagram depicting a transmitter in a multicarrier system, where $M_c$ independent source signals are to be transmitted over a single satellite channel.

FIG. 2 illustrates a block diagram depicting a transmitter in a multicarrier system, where $M_c$ independent source signals are to be transmitted over a single satellite channel. Each independent bit source, $1, \ldots, M_c$, is FEC encoded via the respective encoder $\mathbf{101}_1, \ldots, \mathbf{101}_{M_c}$, interleaved via the respective interleaver $\mathbf{103}_1, \ldots, \mathbf{103}_{M_c}$, and mapped onto a two dimensional M-ary constellation (e.g., QPSK, 8PSK, 16APSK., etc.) by the respective modulator $\mathbf{105}_1, \ldots, \mathbf{105}_{M_c}$. The resulting signals $\underline{a}_1, \ldots, \underline{a}_{M_c}$ reflect the complex-valued symbol sequences $\{a_{m,k}; k=0, 1, \ldots, N-1; m=1, 2, \ldots, M_c\}$ at the symbol rate $T_S^{-1}$. The resulting symbol sequences are processed by the respective transmit pulse-shaping filters $\mathbf{107}_1, \ldots, \mathbf{107}_{M_c}$ with respective impulse responses $p_{1,T}(t), \ldots, p_{M_c,T}(t)$ to generate the respective baseband modulated signals:

$$s_m(t) = \sum_k a_{m,k} \cdot p_{m,T}(t - kT_s) \quad (1)$$

Where $T_S$ is the symbol period.

Each signal is then frequency-translated to its respective slot or center frequency and combined, where the composite signal can then be described as:

$$s_c(t) = \sum_k s_m(t) \frac{\exp(j(2\pi f_m t + \theta_m))}{\sqrt{M_c}} \quad (2)$$

where $f_m$ and $\theta_m$ are the center frequency and carrier phase of the $m^{th}$ channel, respectively. According to one embodiment, for better utilization of bandwidth, the case of a uniform spacing in frequency ($\Delta f$) is considered, but in other embodiments the techniques of the present invention may be applied to any frequency plan. Also, according to this embodiment, $p_{m,T}$ is the transmit pulse shaping filter.

The signal composite of equation (2) is then processed by the satellite transponder 120, which includes an input multiplexing (IMUX) filter 121, a nonlinear traveling wave tube amplifier (TWTA) or high power amplifier (HPA) 123, and an output multiplexing (OMUX) filter 125. The IMUX filter selects the desired group of $M_c$ carriers, thereby limiting the impact of adjacent uplink carriers. The OMUX filter follows the TWTA and is used to limit nonlinear interference to adjacent transponders. According to one embodiment, the frequency response associated with the IMUX and OMUX are obtained by using a scaling formula of the corresponding filter responses (as detailed in the ETSI DVB-S2 standard, ETSI EN 302 307) with a scale factor of $M_c$, or $$R'(f) = R(f/M_c) \quad (3)$$

$$G'(f) = \frac{1}{M_c} \cdot G(f/M_c) \quad (4)$$

Figure 3:
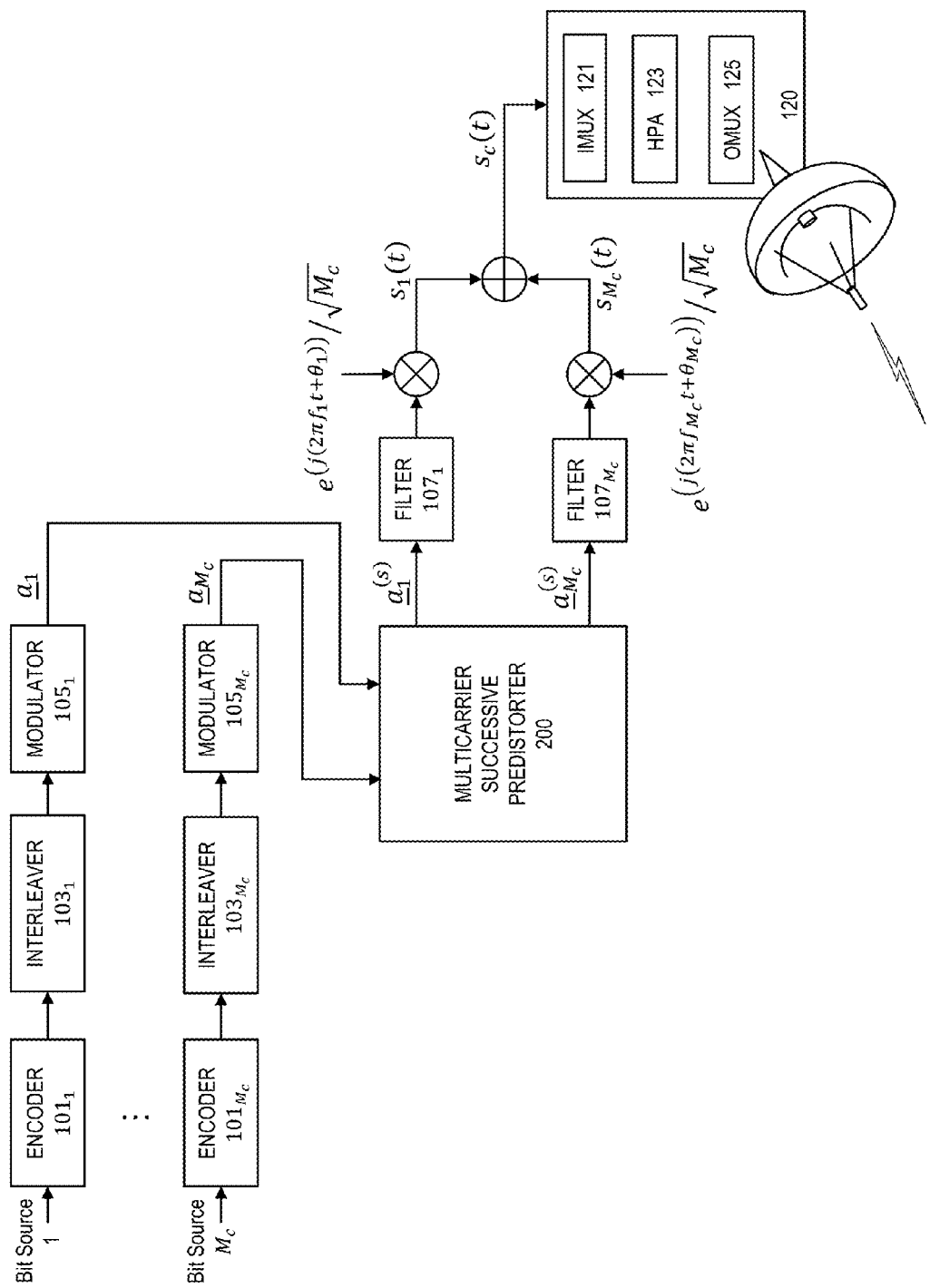
FIG. 3 illustrates a block diagram depicting the multicarrier transmitter of FIG. 2, employing a multicarrier predistorter, in accordance with example embodiments.

FIG. 3 illustrates a block diagram depicting the multicarrier transmitter of FIG. 2, employing a multicarrier predistorter, in accordance with example embodiments. With reference to FIG. 3, the like numbered blocks perform the same functions, and thus the associated description will not be repeated here. The multicarrier transmitter of FIG. 3 includes the multicarrier successive predistorter 200, which predistorts the signal sequences via successive stages. The complex-valued symbol sequences output from the modulators, $\mathbf{105}_1, \ldots, \mathbf{105}_{M_c}$ $\{a_{m,k}; k=0, 1, \ldots, N-1; m=1, 2, \ldots, M_c\}$, are fed into the multicarrier predistorter, and the output of the successive predistorter (with S stages) is given by $a_{m,k}^{(s)}$; $k=0, 1 \ldots, N-1; m=1, 2, \ldots, M_c$, which is also at the symbol rate $T_S^{-1}$.

Figure 4:
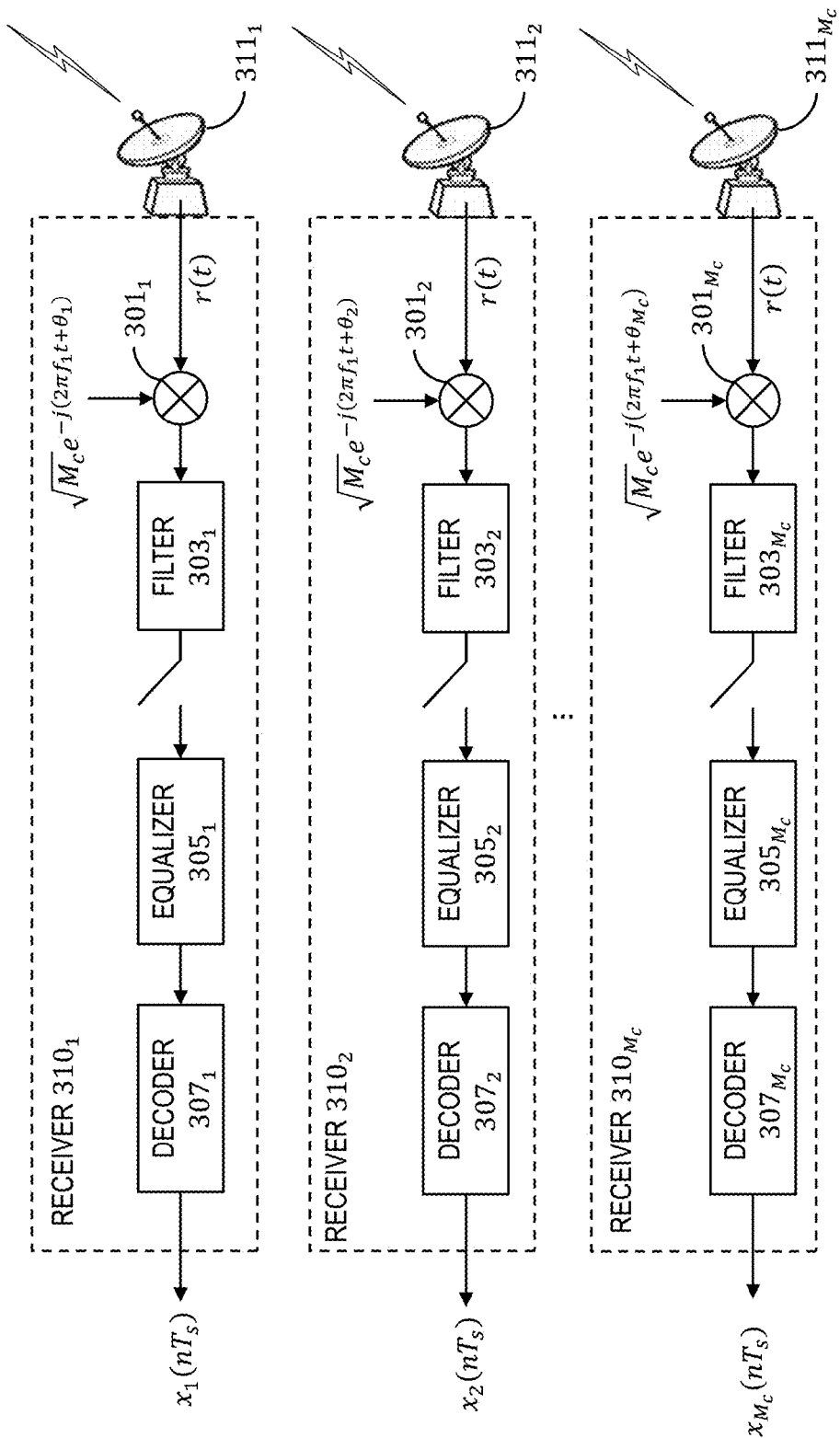
FIG. 4 illustrates a block diagram depicting single carrier receivers, in accordance with example embodiments.

FIG. 4 illustrates a block diagram depicting single carrier receivers $\mathbf{310}_1, \mathbf{310}_2, \ldots, \mathbf{310}_{M_c}$, in accordance with example embodiments. The receivers may be co-located or at geographically different locations. Each receiver receives the transmitted signal as the received signal r(t) received via the receiver antenna 311. Each receiver tunes to the carrier and phase of the respective carrier signal destined for that receiver. In this example, the carrier signal $s_1(t)$ is destined for the receiver $\mathbf{310}_1 \ldots$ the carrier signal $s_{M_c}(t)$ is destined for the receiver $\mathbf{310}_{M_c}$. The down-converters ($\mathbf{301}_1$, $301_2, \ldots, 301_{M_c}$) translate or convert each of the receive carrier signals from the respective carrier frequency to a baseband complex signal centered at zero frequency. The down-converted baseband signals are fed to the respective receive filters $303_1, 303_2, \ldots, 303_{M_c}$, with the respective impulse responses $p_{1,R}(t), p_{2,R}(t), \ldots, p_{M_c,R}(t)$. The signal at the each receiver filter output can be expressed as:

$$x_m(t) = \int_{-\infty}^{\infty} r(t-\tau)\sqrt{M_c}e^{-j(2\pi f_m(t-\tau)+\theta_m)} \cdot p_{n,R}(\tau)d\tau. \quad (5)$$

According to one embodiment, the signal $x_m(t)$ from each filter is then sampled at multiples of the symbol rate. By way of example, at the output of the sampler, the samples are at symbol rate $x_m(nT_S)$. Next, each of the equalizers $305_1, 305_2, \ldots, 305_{M_c}$ is employed for equalizing the sample outputs from the respective sampler to compensate for the impact of IMUX and OMUX filters of the satellite transponder. By way of example, fractionally-spaced equalization may be employed to compensate for the linear distortion introduced by the IMUX and OMUX filters. Each equalizer output (e.g., $y_m((n+\epsilon_m)T_S)$) is utilized to generate log-likelihood ratios, which are passed to the respective decoder. Each of the decoders $307_1, 307_2, \ldots, 307_{M_c}$ utilizes the log-likelihood ratios for a determination of the respective transmitted signal constellation points, and from there determines the corresponding source symbol and code-bits based on the received signal.

Figure 5A:
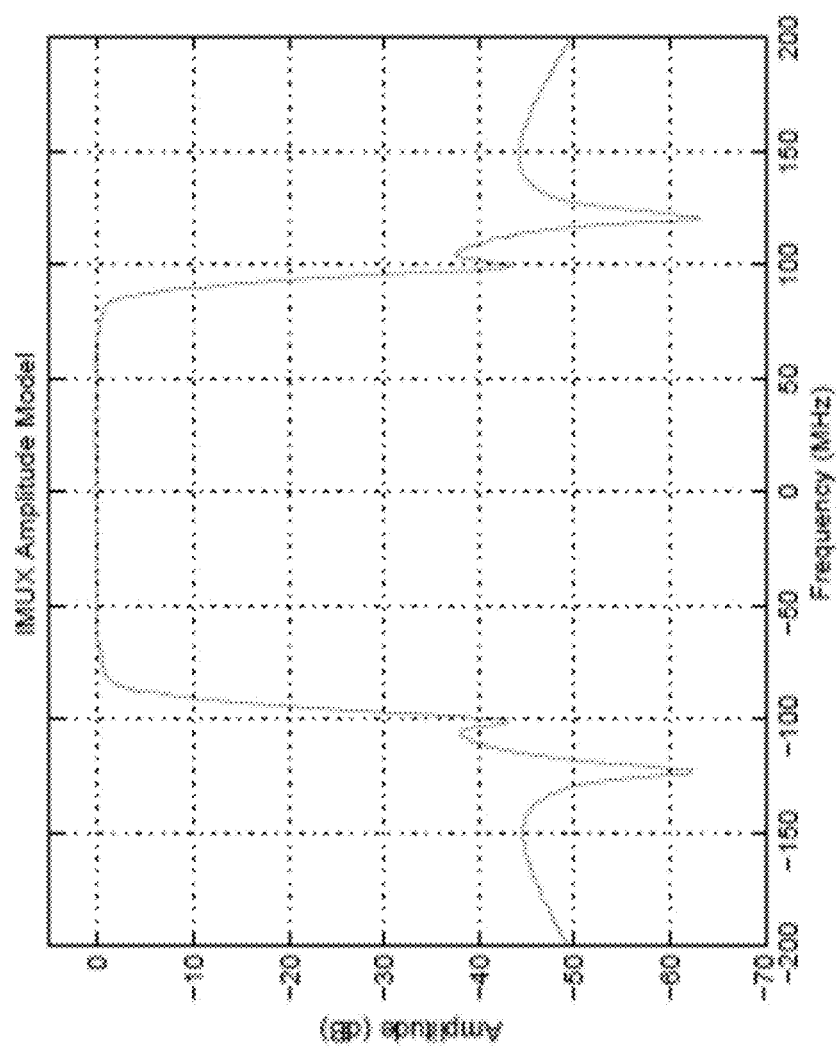
FIGS. 5A and 5B illustrate example frequency responses of the IMUX filter of FIGS. 2 and 3.
Figure 5B:
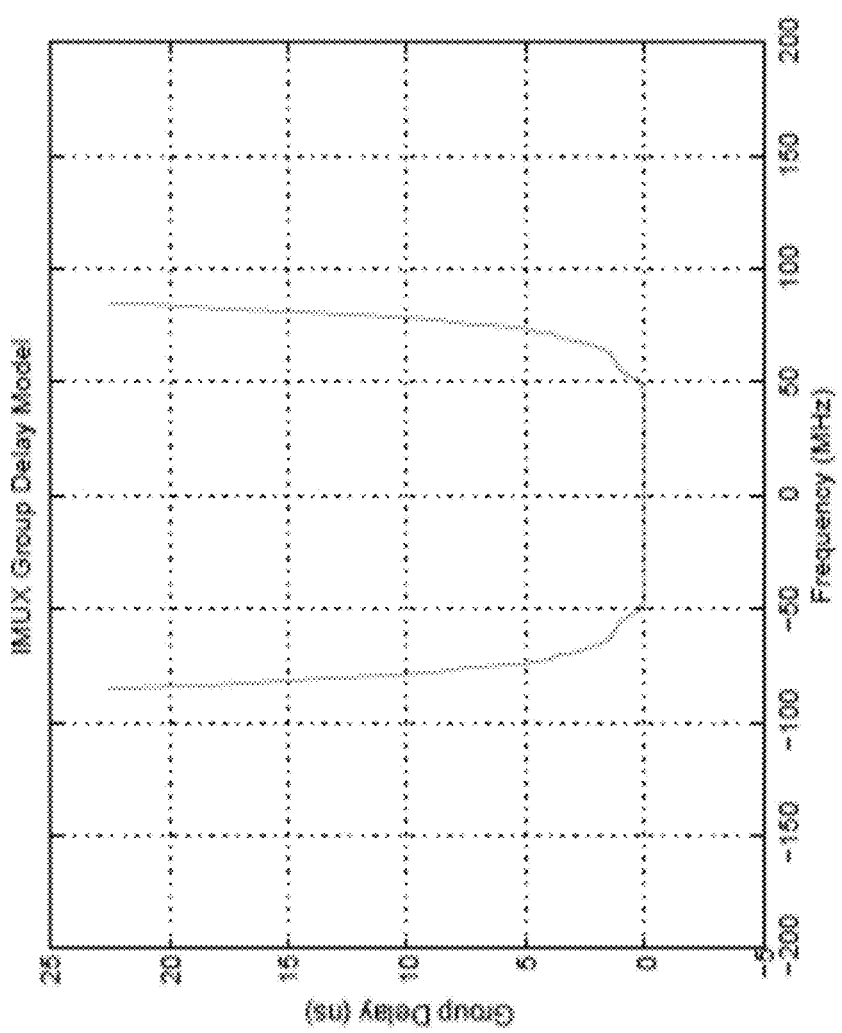
Figure 5C:
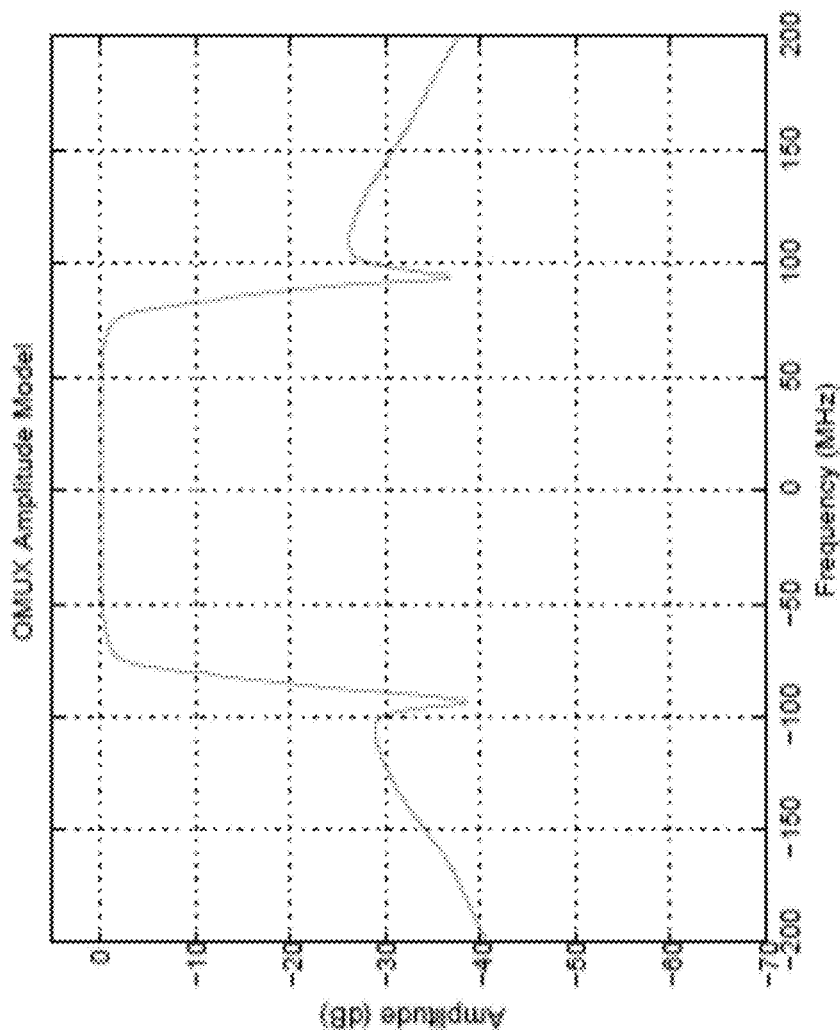
FIGS. 5C and 5D illustrate example frequency responses of the OMUX filter of FIGS. 2 and 3.
Figure 5D:
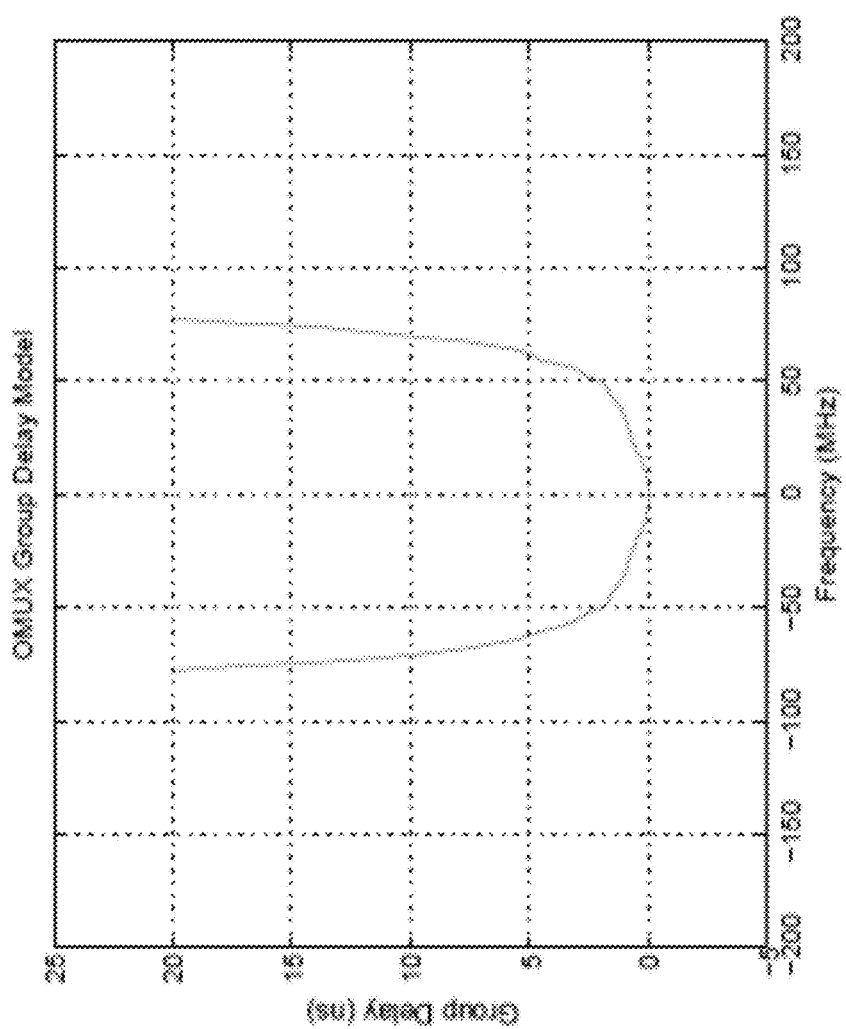
Figure 5E:
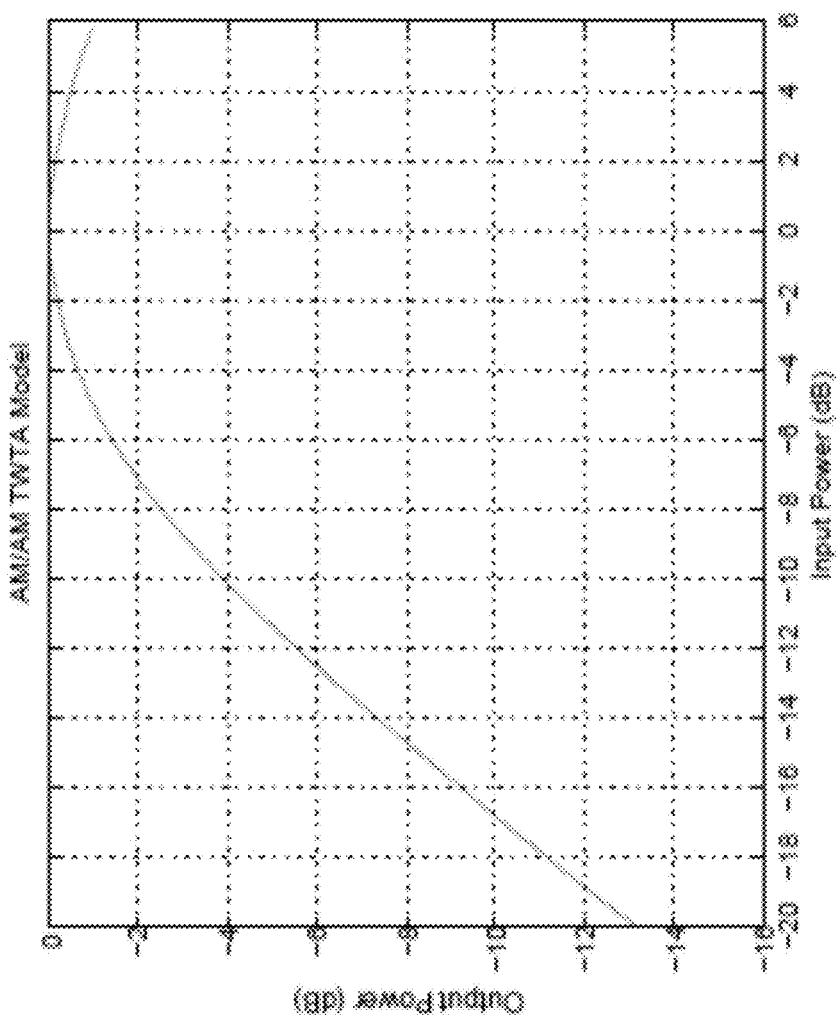
FIGS. 5E and 5F illustrate examples of the AM/AM characteristics reflecting the amplitude distortions and the AM/PM characteristics reflecting the phase distortions, respectively, introduced by the HPA of FIGS. 2 and 3.
Figure 5F:
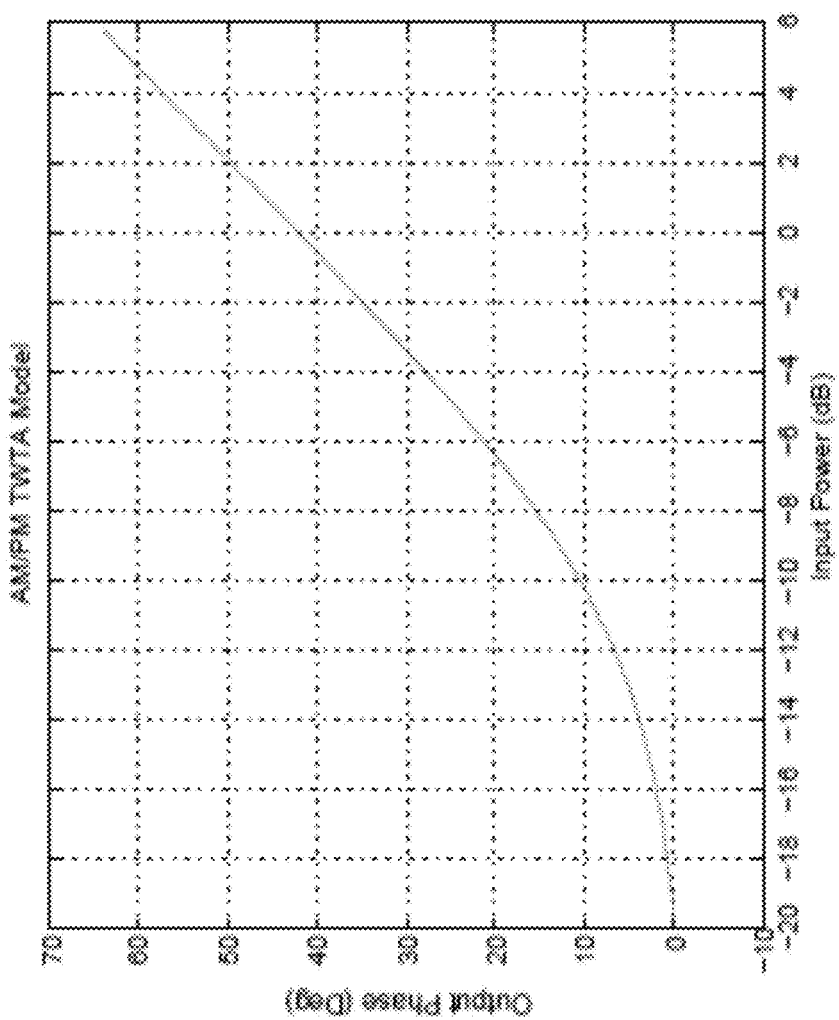

FIGS. 5A and 5B show example frequency responses of the IMUX filter of FIGS. 2 and 3, and FIGS. 5C and 5D show example frequency responses of the OMUX filter of FIGS. 2 and 3, all for the case of $M_c=4$. Further, FIGS. 5E and 5F show examples of the AM/AM characteristics reflecting the amplitude distortions and the AM/PM characteristics reflecting the phase distortions, respectively, introduced by the HPA of FIGS. 2 and 3. Downlink noise n(t) is AWGN with single-sided power spectral density of $N_0$ (Watt/Hz), which corrupts the signal at the OMUX output, such that the received signal can be denoted as:

$$r(t) = s_{OMUX}(t) + n(t) \quad (6)$$

I. Multicarrier Successive Predistortion

In accordance with example embodiments, with regard to the successive multicarrier predistorter 200 of FIG. 3, novel predistortion approaches are provided. Such approaches provide powerful non-linear distortion compensation techniques that can be deployed entirely at the transmitter or gateway (e.g., the gateways 138 of FIG. 1). Such non-linear distortion compensation techniques mitigate and compensate for the adverse impact of nonlinear distortion that results when a single satellite TWTA or HPA is shared by multiple carriers. Further, such approaches contemplate the situation of achieving high-bandwidth efficiency where the carriers employ high-order modulation, and the satellite TWTA is operated near saturation. By way of example, at a system gateway, the transmission symbols of each bit source are modified such that, upon reception, the received symbols exhibit a minimum amount of IMD-induced clustering (resulting from the processing through a common non-linear satellite channel). More specifically, embodiments of the present invention provide for a multicarrier predistortion (PD) technique that comprises estimation of the distortion that would result from passing the transmission signal (reflecting a composite of the signals of each carrier that will share the transmission channel) through the nonlinear satellite channel. The distortion estimate is then used to generate an error signal that is driven to zero by applying the estimation in a successive staged manner. Further, the predistortion is applied by the gateway transmitter, prior to transmission of the carrier signals to the destination receivers. More specifically, the distortion determination is performed based on an estimation of the IMD effects (the inter-relational effects) of all adjacent carriers sharing the common channel (being processed together through the non-linear channel). While the determination takes into account such inter-relational effects of all the carriers, however, the error signal is driven to zero, and the predistortion is applied, for each carrier individually. Further, with the approaches of the present invention, a relatively simple single carrier receiver can be employed at the receiver end to receive the composite signal transmitted by the gateway via the multicarrier satellite channel, and to tune to and demodulate and decode the individual carrier signal destined for the respective terminal. As such, in view of the predistortion applied by the gateway to each individual carrier, the resulting carrier signal received by the destination terminal will already exhibit or reflect compensation for the IMD resulting from the transmission of the composite signal via a single satellite channel.

Figure 6A:
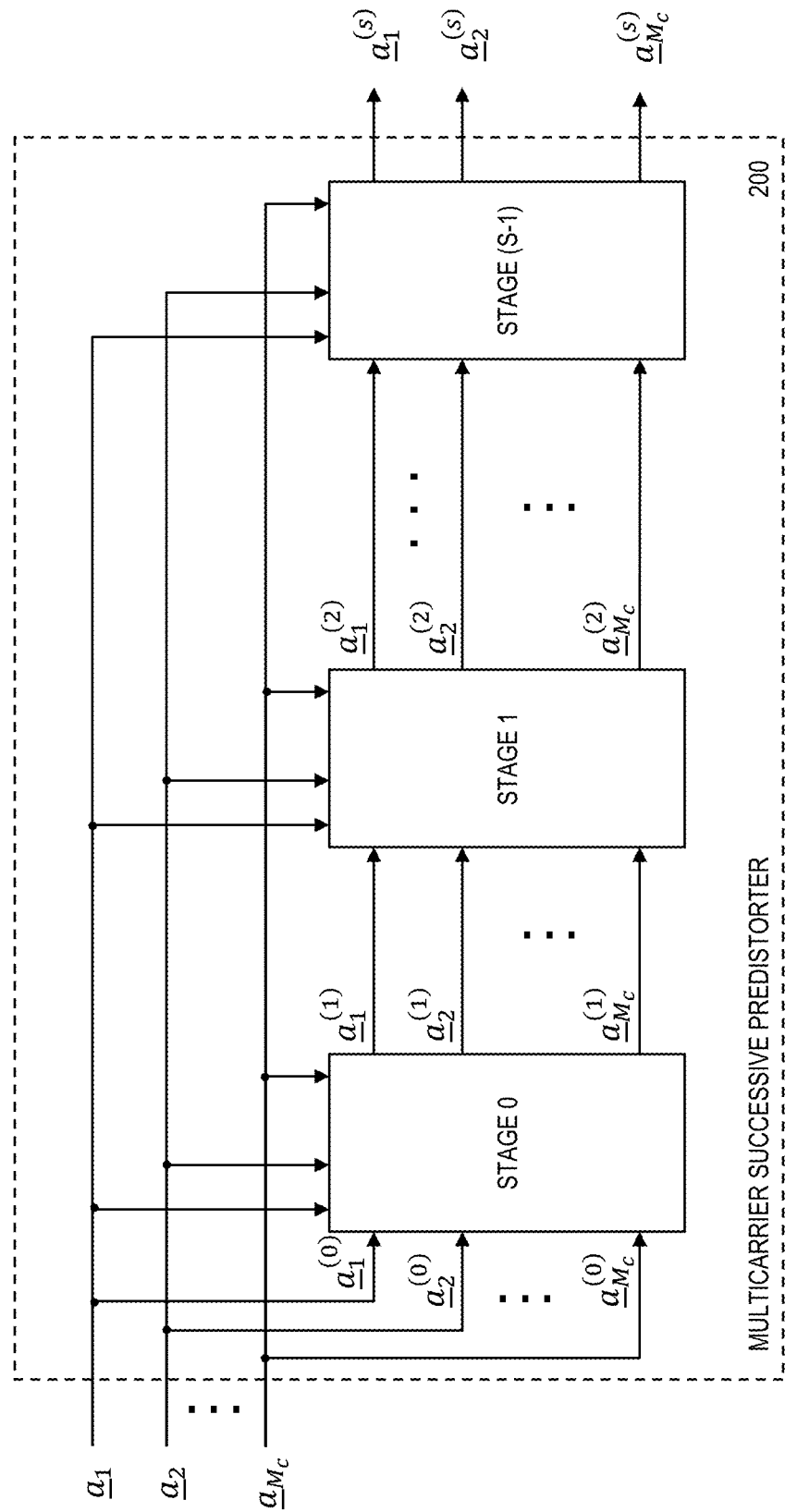
FIG. 6A illustrates a block diagram depicting the multicarrier successive predistorter of FIG. 3, in accordance with example embodiments.
Figure 6B:
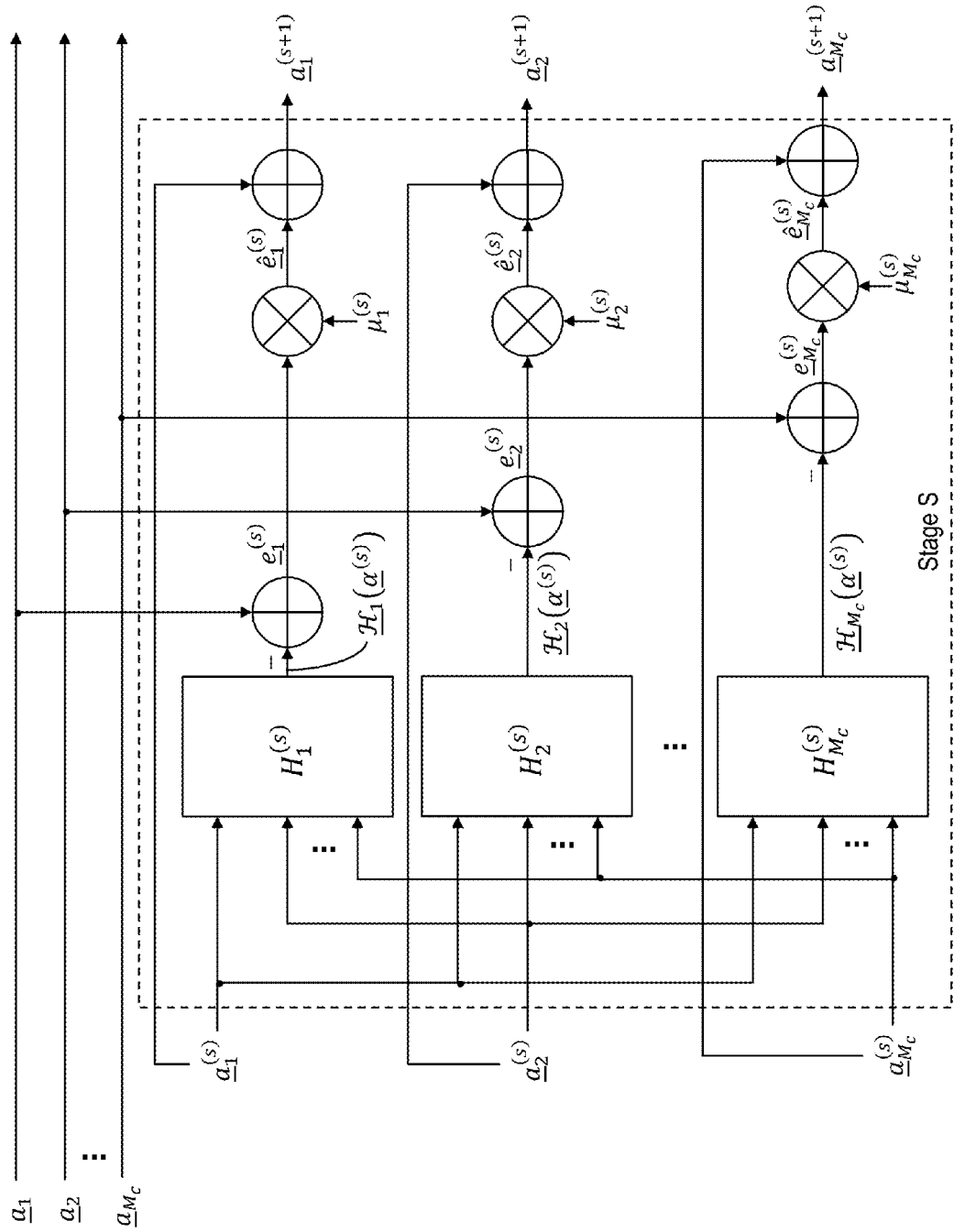
FIG. 6B illustrates a block diagram depicting the $S^{th}$ stage of the multicarrier successive predistorter of FIG. 6A, in accordance with example embodiments.

FIG. 6A illustrates a block diagram depicting the multicarrier successive predistorter 200 of FIG. 3, in accordance with example embodiments, and FIG. 6B illustrates a block diagram depicting the $s^{th}$ stage of the multicarrier successive predistorter of FIG. 6A, in accordance with example embodiments. As discussed above, the predistortion techniques of the example embodiments of the present invention are applied in the sequential staged manner.

With reference to FIG. 6A, a formulation is developed whereby the predistoerter 200 applies an estimated predistortion (successively in stages) to the vector of input symbols $\underline{a}_m^{(s)}$. The input vector $\underline{a}_m^{(s)}$ comprises a vector of predistorted symbols from the previous stage of the predistorter, which reflects a vector of complex-valued data symbols associated with the $m^{th}$ carrier at the $s^{th}$ stage, which can be denoted as:

$$\underline{a}_m^{(s)} = [a_{m,0}^{(s)} a_{m,1}^{(s)} \ldots a_{m,N-1}^{(s)}]^T, \quad (7)$$

where $s=(0, 1, \ldots, S-1)$, $1 \leq m \leq M_c$, and N is the length of the data block (which typically spans a codeword). For the first stage (where there is no estimate from a previous stage), the predistoerter vector input is composed of the undistorted vector of data symbols $\underline{a}_1, \underline{a}_2, \ldots, \underline{a}_{M_c}$, which is represented in FIG. 6A as:

$$\underline{a}_m^{(0)} = \underline{a}_m = [a_{m,0} a_{m,1} \ldots a_{m,N-1}^{(s)}]^T, \quad (8)$$

Accordingly, as depicted in FIG. 6A, at Stage 0, the predistorter applies an estimated predistortion to the vector of input symbols $\underline{a}_m^{(0)} = [\underline{a}_1^{(0)} \underline{a}_2^{(0)} \ldots \underline{a}_{M_c}^{(0)}]$ (which is the undistorted vector of data symbols $\underline{a}_1, \underline{a}_2, \ldots, \underline{a}_{M_c}$). At Stage 1, the predistorter applies an estimated predistortion to the vector of input symbols $\underline{a}_m^{(1)} = [\underline{a}_1^{(1)} \underline{a}_2^{(1)} \ldots \underline{a}_{M_c}^{(1)}]$ (which is the distorted vector of data symbols output from Stage 0. At the last Stage (s-1), the predistorter applies an estimated predistortion to the vector of input symbols $\underline{a}_m^{(s)} = [\underline{a}_1^{(s)} \underline{a}_2^{(s)} \ldots \underline{a}_{M_c}^{(s)}]$ (which is the distorted vector of data symbols output from Stage (s-2). The final output of the predistorter is the final predistorted data symbol vectors $\underline{a}_1^{(s)}, \underline{a}_2^{(s)}, \ldots, \underline{a}_{M_c}^{(s)}$ that are forwarded to the respective filters $107_1, \ldots, 107_{M_c}$.

Further, a vector of symbols $\underline{\alpha}^{(s)}$, composed of the corresponding vector of symbols associated with each one of the $M_c$ carriers sharing the nonlinearity, can be denoted as:

$$\underline{\alpha}^{(s)} = \begin{bmatrix} \underline{a}_1^{(s)} \\ \underline{a}_2^{(s)} \\ \vdots \\ \underline{a}_{M_c}^{(s)} \end{bmatrix} \quad (9)$$

The vector $\underline{\mathcal{H}}_{m_d}(\underline{\alpha}^{(s)})$, of length N, reflects the estimate of distortion experienced by a specific $m_d^{th}$ carrier (where $1 \leq m_d \leq M_c$), using the vector $\underline{\alpha}^{(s)}$ for the $s^{th}$ stage defined by equation (9). With reference to FIG. 6B, the vector $\underline{\mathcal{H}}_{m_d}(\underline{\alpha}^{(s)})$ for the $s^{th}$ stage is $[\underline{\mathcal{H}}_1(\underline{\alpha}^{(s)}) \; \underline{\mathcal{H}}_2(\underline{\alpha}^{(s)}) \ldots \underline{\mathcal{H}}_{m_d}(\underline{\alpha}^{(s)})]$, where $\underline{\mathcal{H}}_1(\underline{\alpha}^{(s)}), \underline{\mathcal{H}}_2(\underline{\alpha}^{(s)}) \ldots \underline{\mathcal{H}}_{m_d}(\underline{\alpha}^{(s)})$ are the outputs of the processing elements $H_1^{(s)}, H_2^{(s)}, \ldots, H_{M_c}^{(s)}$ of the $s^{th}$ stage depicted in FIG. 6B. According to example embodiments, the determination of the vector $\underline{\mathcal{H}}_{m_d}(\underline{\alpha}^{(s)})$ is discussed in further detail below in the context of two example approaches.

The distortion estimate is then utilized to generate an error vector relative to the undistorted constellation, individually, for each carrier $m_d=1, 2, \ldots, M_c$, by subtracting the vector $\underline{\mathcal{H}}_{m_d}(\underline{\alpha}^{(s)})$ for each carrier from the respective input vector $\underline{a}_{m_d}$, as follows:

$$\underline{e}_{m_d}^{(s)} = \underline{a}_{m_d} - \underline{\mathcal{H}}_{m_d}(\underline{\alpha}^{(s)}). \quad (10)$$

Accordingly, for each stage, the vector $\underline{\alpha}^{(s)}$ takes into consideration the predistorted symbol vector of all carriers from the previous stage $\underline{a}_{m_d}^{(s)}$ (per equation (9), above). Further, for each stage, the vector $\underline{\alpha}^{(s)}$ is used to determine the respective error vector for each individual carrier $\underline{e}_{m_d}^{(s)}$ (per equation (10), above). For each individual carrier, the predistortion determination processing for each stage thereby accounts for the predistortion estimates (from the previous stage) for all carriers.

The error vector in equation (10) is driven to zero by the successive application of the predistortion. By way of example, the predistortion output can be generated by modifying the predistorted symbols from the previous stage with a correction term that is proportional to the error vector. More specifically, at each stage, the error vector for each carrier $\underline{e}_{m_d}^{(s)}$ is processed based on a step-size factor or sequence $\mu_{m_d}^{(s)}$. By way of example, with further reference to FIG. 6B, for each carrier, the error vector $\underline{e}_{m_d}^{(s)}$ is multiplied by the step-size sequence to generate the modified error vector $\underline{\hat{e}}_{m_d}^{(s)}$. Finally, the predistortion output at the $s^{th}$ stage for the desired $m_d^{th}$ carrier is generated by adding the modified error vector $\underline{\hat{e}}_{m_d}^{(s)}$ to the predistorted symbol vector from the previous stage, as follows:

$$\underline{a}_{m_d}^{(s+1)} = \underline{a}_{m_d}^{(s)} + \mu_{m_d}^{(s)} \underline{e}_{m_d}^{(s)}, \quad (11)$$

where $\mu_{m_d}^{(s)}$ reflects an adaptation constant (which can be different for each stage), and where $1 \leq m_d \leq M_c$.

The step-size sequence is defined to satisfy certain conditions, including being positive and decreasing, to ensure progress toward a solution. Further, the step-size sequence serves to optimize the performance of the predistortion process by maximizing convergence speed (reduction of the number of predistoerter stages) while minimizing residual error. With respect to the maximization of convergence speed and the minimization of residual error, these concepts are in the context of a tradeoff between a practical or efficient processing time (a practical number of stages) and an acceptable level of performance (reduction of the residual error to an acceptable level so as not to pose a significant adverse effect on performance). In other words, the sequence $\mu_{m_d}^{(s)}$ is designed to achieve an acceptable and practical compromise between convergence speed and amount of residual error.

In accordance with example embodiments, the novel predistortion techniques of the present invention include two approaches for determining an estimate of the distortion $\underline{\mathcal{H}}_{m_d}(\underline{\alpha}^{(s)})$ experienced by a specific $m_d^{th}$ carrier. At each stage (Stage S), the determination of the distortion estimate vector $\underline{\mathcal{H}}_{m_d}(\underline{\alpha}^{(s)})$ for each carrier is performed by the respective processing element $H_{m_d}^{(s)}$ (e.g., for the $s^{th}$ stage, the respective one of the processing elements $H_1^{(s)}, H_2^{(s)} \ldots, H_{M_c}^{(s)}$ depicted in FIG. 6B). According to such embodiments, these techniques comprise an explicit implementation and a Volterra-based approach.

A. Explicit Approach

According to a first approach, the explicit method of implementing the distortion estimation $\underline{\mathcal{H}}_{m_d}(\underline{\alpha}^{(s)})$ relies on processing the input vector at multiple samples per symbol ($N_{SS}$). More specifically, this explicit method comprises recreating the distortion by processing the inputs of the predistorter at multiple samples per symbol. By way of example, in a first step, the data symbols of each carrier from the previous stage $\underline{a}_{m,n}^{(s)}$ are processed through an interpolating filter, which models the cascade of the transmitted data pulse and the IMUX filter, denoted as the vector $\underline{a}_m^{(s)}(n; L, N_{ss})$, using the data symbols contained in $\underline{\alpha}^{(s)}$, as follows:

$$a_m^{(s)}(n; L, N_{ss}) = \left[ a_{m,n-\frac{L-1}{2}N_{ss}-1}^{(s)} \underline{0}_{N_{ss}-1} a_{m,n-\frac{L-1}{2}+1}^{(s)} \underline{0}_{N_{ss}-1} \cdots a_{m,n+\frac{L-1}{2}N_{ss}-1}^{(s)} \right]^T, \quad (12)$$

where $\underline{0}_K$ reflects the all-zero vector of length K, and L reflects the double-sided memory span of the predistorter.

The vector $\underline{a}_m^{(s)}(n; L, N_{ss})$ for each carrier is subsequently processed (as an inner-product) by the vector of filter coefficients $\underline{\dot{p}}_m$, representing the cascade of the transmit filter 107 ($p_{m,T}$) and the IMUX model, and frequency-translated to the respective center frequency of the respective carrier (the $m^{th}$ carrier), as follows:

$$b_{m,n} = \left( \underline{\dot{p}}_m^T \cdot \underline{a}_m^{(s)}(n; L, S_{ss}) \right) \cdot e^{j\left( 2\pi f_m \frac{n}{N_{ss}} T_s + \theta_m \right)}, \quad (13)$$

where $n = 0, 1, \ldots, N \cdot N_{ss}-1$, and $1 \leq m \leq M_c$. Vector can be formed by stacking the samples $b_{m,n}$ of equation (13) for each one of the $M_c$ carriers, as follows:

$$\underline{s}_m = [b_{m,0} b_{m,1} \ldots b_{m,NN_{ss}-1}]^T. \quad (14)$$

The value $N_{ss}$ in equation (12) should be large enough to avoid the aliasing effect of IMD when $M_c$ carriers share the same transponder.

The composite vector $\underline{\zeta}$ is then formed and scaled to the correct IBO level of the HPA (TWTA), as follows:

$$\underline{\zeta} = \gamma_{IBO} \cdot \sum_{m=1}^{M_c} \underline{s}_m. \quad (15)$$

The AM/AM and AM/PM distortions are computed based on the corresponding TWTA conversion model and applied to each of the samples of $\underline{\zeta}$ producing the distorted sample $\tilde{\zeta}_n$, as follows:

$$\tilde{\zeta}_n = \alpha_{TWTA}(|\zeta_n|) \cdot e^{j(\angle \zeta_n + \psi_{TWTA}(|\zeta_n|))}, \quad (16)$$

where $0 \leq n \leq N \cdot N_{ss}$, and $|\zeta_n|$ and $\angle \zeta_n$ are the amplitude and phase of the input $\zeta_n$, respectively, and $\alpha_{TWTA}(x)$ and $\psi_{TWTA}(x)$ are the amplitude and phase distortion, respectively, of the TWTA model.

Next, the impact of the cascade of the OMUX and receive filters $107_1, \ldots, 107_{M_c}$, (appropriately decimated at the output to one sample per symbol) is replicated (using the samples $\tilde{\zeta}_n$) to form the respective vectors:

$$\underline{\rho}(n; L, N_{ss}) = \left[ \tilde{\zeta}_{n - \frac{L-1}{2} N_{ss}} \tilde{\zeta}_{n - \frac{L-1}{2} N_{ss}+1} \cdots \tilde{\zeta}_{n + \frac{L-1}{2} N_{ss}} \right]^T, \quad (17)$$

which reflects a vector of filter coefficients $\underline{\ddot{p}}_m$, representing the cascade of the receive filter $p_{m,R}$ and the OMUX model. The vector $\underline{\rho}(n; L, N_{ss})$ is then be processed by the filter $\underline{\ddot{p}}_{m_d}$ (as an inner-product) and frequency-translated to the desired $m_d^{th}$ channel, whose distortion is estimated as follows:

$$u_{m_d,n} = \left( \underline{\ddot{p}}_{m_d}^T \cdot \underline{\rho}(n; L, N_{ss}) \right) \cdot e^{-j\left(2\pi f_{m_d} \frac{n}{N_{ss}} T_s + \theta_{m_d}\right)}. \quad (18)$$

Further, the vector $\underline{u}_{m_d}$ is formed by stacking only the samples of $u_{m_d,n}$ that are spaced by $N_{ss}$, or:

$$\underline{u}_{m_d} = [u_{m_d,0} u_{m_d,N_{ss}} \cdots u_{m_d,(N-1)N_{ss}}]^T. \quad (19)$$

Finally, the explicit implementation of the distortion is determined as follows:

$$\mathcal{H}_{m_d}(\underline{\alpha}^{(s)}) = \underline{u}_{m_d} / \gamma_{m_d}, \quad (20)$$

where $\gamma_{m_d}$ reflects a complex-valued gain correction configured to remove the effect of the warping caused by the IMD distortion, which is determined as follows:

$$\gamma_{m_d} = \underline{u}_{m_d}^T \cdot \underline{a}_{m_d}^*. \quad (21)$$

B. Volterra Approach

According to a second approach, the Volterra method of implementing the distortion estimation $\mathcal{H}_{m_d}(\underline{\alpha}^{(s)})$ operates on one sample per symbol, and utilizes an analytical characterization of the nonlinear IMD based on a multicarrier Volterra series representation.

By way of example, the distortion estimation $\mathcal{H}_{m_d}(\underline{\alpha}^{(s)})$ can be obtained as the output of a 3rd-order Volterra filter, whereby:

$$\mathcal{H}_{m_d}(\underline{\alpha}^{(s)}) = H_{m_d}^T \cdot a_{NL}^{(s)(3)}, \quad (22)$$

where $H_{m_d} \triangleq [\underline{h}_{m_d}(0) \underline{h}_{m_d}(1) \ldots \underline{h}_{m_d}(N-1)]$ and $a_{NL}^{(s)(3)} = [\underline{a}_{NL}^{(s)(3)}(0) \underline{a}_{NL}^{(s)(3)}(1) \ldots \underline{a}_{NL}^{(s)(3)}(N-1)]$.

The vector $\underline{h}_{m_d}(n)$ models the 1st-order and 3rd-order IMD terms in the Volterra filter, whereby:

$$\underline{h}_{m_d}(n) \triangleq \begin{bmatrix} \underline{h}_{m_d}^{(1)}(n; L^{(1)}) \\ \underline{h}_{m_d}^{(3)}(n; L^{(3)}) \end{bmatrix}; \quad m_d = 1, 2, \ldots, M_c, \quad (23)$$

where $$\underline{h}_{m_d}^{(1)}(n; L^{(1)}) \triangleq \begin{bmatrix} \underline{\eta}_{1m_d}^{(1)}(n; L^{(1)}) \\ \vdots \\ \underline{\eta}_{M_c m_d}^{(1)}(n; L^{(1)}) \end{bmatrix}, \quad (24)$$

and $$\underline{h}_{m_d}^{(3)}(n; L^{(3)}) \triangleq \begin{bmatrix} \underline{\eta}_{m_1 m_2 m_3 m_d}^{(3)}(n; L^{(3)}) \\ \vdots \\ \underline{\eta}_{m_1' m_2' m_3' m_d}^{(3)}(n; L^{(3)}) \end{bmatrix}, \quad (25)$$

The vectors $\underline{h}_{m_d}^{(1)}(n; L^{(1)})$ and $\underline{h}_{m_d}^{(3)}(n; L^{(3)})$ of (24)-(25) in turn comprise vectors $\underline{\eta}_{mm_d}^{(1)}(n; L^{(1)})$ and $\underline{\eta}_{m_1 m_2 m_3 m_d}^{(3)}(n; L^{(3)})$, which incorporate the memory of the 1st-order interference from the $m^{th}$ carrier, of size $L^{(1)}$ symbols, and the memory of the 3rd-order interference, of size $L^{(3)}$ symbols, associated with carrier combination $[m_1 m_2 m_3]$, respectively, as follows:

$$\underline{\eta}_{mm_d}^{(1)}(n; L^{(1)}) \triangleq \qquad (26)$$

$$e^{j(2\pi(f_m - f_{m_d})nT_s + (\theta_m - \theta_{m_d}))} \cdot \begin{bmatrix} h_{mm_d}^{(1)}\left(\left(\frac{L^{(1)} - 1}{2}\right)T_s; f_m - f_{m_d}\right) \\ h_{mm_d}^{(1)}\left(\left(\frac{L^{(1)} - 1}{2} - 1\right)T_s; f_m - f_{m_d}\right) \\ h_{mm_d}^{(1)}\left(\left(-\frac{L^{(1)} - 1}{2}\right)T_s; f_m - f_{m_d}\right) \end{bmatrix}$$

and $$\underline{\eta}_{m_1 m_2 m_3 m_d}^{(3)}(n; L^{(3)}) \triangleq \qquad (27)$$

$$2^{1-\delta_{m_1 m_2}} \cdot e^{j(2\pi(f_{m_1} + f_{m_2} - f_{m_3} - f_{m_d})nT_s + (\theta_{m_1} + \theta_{m_2} - \theta_{m_3} - \theta_{m_d}))} \cdot$$

$$\begin{bmatrix} h_{m_1 m_2 m_3 m_d}^{(3)}\left(\frac{L^{(3)} - 1}{2}T_s, \frac{L^{(3)} - 1}{2}T_s, \frac{L^{(3)} - 1}{2}T_s; f_{m_1} + f_{m_2} - f_{m_3} - f_{m_d}\right) \\ h_{m_1 m_2 m_3 m_d}^{(3)}\left(\frac{L^{(3)} - 1}{2}T_s, \frac{L^{(3)} - 1}{2}T_s, \left(\frac{L^{(3)} - 1}{2} - 1\right)T_s; f_{m_1} + f_{m_2} - f_{m_3} - f_{m_d}\right) \\ h_{m_1 m_2 m_3 m_d}^{(3)}\left(-\frac{L^{(3)} - 1}{2}T_s, \frac{L^{(3)} - 1}{2}T_s, \frac{L^{(3)} - 1}{2}T_s; f_{m_1} + f_{m_2} - f_{m_3} - f_{m_d}\right) \end{bmatrix}$$

where $h_{mm_d}^{(1)}(t; f)$ and $h_{m_1 m_2 m_3 m_d}^{(3)}(t_1, t_2, t_3; f)$ reflect the generalized Volterra kernels of the 1st-order and 3rd-order.

The corresponding vector of symbols in equation (22) can be denoted as follows:

$$\underline{a}_{NL}^{(s)(3)}(n) \triangleq \begin{bmatrix} \underline{a}^{(s)(1)}(n; L^{(1)}) \\ \underline{a}^{(s)(3)}(n; L^{(3)}) \end{bmatrix}, \quad (28)$$

where $$\underline{a}^{(s)(1)}(n; L^{(1)}) \triangleq \begin{bmatrix} \underline{a}_1^{(s)(1)}(n; L^{(1)}) \\ \vdots \\ \underline{a}_{M_c}^{(s)(1)}(n; L^{(1)}) \end{bmatrix}, \quad (29)$$

and

-continued $$\underline{a}^{(s)(3)}(n; L^{(3)}) \triangleq \begin{bmatrix} a^{(s)(3)}_{m_1 m_2 m_3}(n; L^{(3)}) \\ \vdots \\ a^{(s)(3)}_{m_1' m_2' m_3'}(n; L^{(3)}) \end{bmatrix}. \quad (30)$$

In equations (29)-(30), $\underline{a}_m^{(s)(1)}(n; L^{(1)})$ reflects the vector of interfering symbols of the 1st-order from the $m^{th}$ carrier, with double-sided memory of $L^{(1)}$ symbols, as follows:

$$\underline{a}_m^{(s)(1)}(n; L^{(1)}) \triangleq \begin{bmatrix} a^{(s)}_{m,n-\frac{L^{(1)}-1}{2}} \\ a^{(s)}_{m,n-\frac{L^{(1)}-1}{2}+1} \\ \vdots \\ a^{(s)}_{m,n+\frac{L^{(1)}-1}{2}} \end{bmatrix}, \quad (31)$$

and $\underline{a}_{m_1 m_2 m_3}^{(s)(3)}(n; L^{(3)})$ reflects the vector of interfering symbols of the 3rd-order associated with the $[m_1 m_2 m_3]$ carrier combination and double-sided memory of $L^{(3)}$ symbols, as follows:

$$\underline{a}_{m_1 m_2 m_3}^{(s)(3)}(n; L^{(3)}) \triangleq \begin{bmatrix} a^{(s)}_{m_1,n-\frac{L^{(3)}-1}{2}} \cdot a^{(s)}_{m_2,n-\frac{L^{(3)}-1}{2}} \cdot a^{(s)*}_{m_3,n-\frac{L^{(3)}-1}{2}} \\ a^{(s)}_{m_1,n-\frac{L^{(3)}-1}{2}} \cdot a^{(s)}_{m_2,n-\frac{L^{(3)}-1}{2}} \cdot a^{(s)*}_{m_3,n-\frac{L^{(3)}-1}{2}+1} \\ \vdots \\ a^{(s)}_{m_1,n+\frac{L^{(1)}-1}{2}} \cdot a^{(s)}_{m_2,n+\frac{L^{(3)}-1}{2}} \cdot a^{(s)*}_{m_3,n+\frac{L^{(3)}-1}{2}} \end{bmatrix}. \quad (32)$$

In the Volterra-based approach, the filter coefficients $h_{m m_d}^{(1)}$ and $h_{m_1 m_2 m_3 m_d}^{(3)}$ are known to or preconfigured in the predistorter. Further details of such Volterra filter based estimations are described in the article B. F. Beidas, "Intermodulation distortion in multicarrier satellite systems: Analysis and turbo volterra equalization," IEEE Trans. Comm., vol. 59, no. 6, pp. 1580-1590, June 2011. Further, by way of example, the filter coefficients may be adaptively determined using a recursive least squares (RLS) filter algorithm, which would facilitate a rapid response to any variation in the operating environment (such as the amplifier back-off level) without a priori knowledge of the nonlinear channel characteristics. Such an approach is advocated in the article: B. F. Beidas and R. I. Seshadri, "Analysis and compensation for nonlinear interference of two high-order modulation carriers over satellite link," IEEE Trans. Comm., vol. 58, no. 6, pp. 1824-1833, June 2010). Also, the text S. Haykin, Adaptive Filter Theory, 2nd ed. Englewood Cliffs, N.J.: Prentice-Hall, 1991 provides a description of such an RLS filter algorithm. By way of further example, one possible realization of the adaptation may comprise a training phase, during which the transmitter or gateway sends known/training sequences $\underline{a}_{(m,train)}$; $m=1, 2, \ldots, M_c$, simultaneously on all $M_c$ carriers. The corresponding $M_c$ receivers independently demodulate the respective in-band received signal to generate $x_{m,train}(nT_S)$; $m=1, 2, \ldots, M_c$. The demodulated sequence could then be fed back to the gateway, which may then perform the RLS adaptation, formulated to minimize the least-squares value of the error, as follows:

$$\varepsilon_m^{(LS)}(n) = \sum_{i=1}^{n} \lambda^{n-1} \cdot |x_{m,train}(i) - \underline{h}_m^T(n) \cdot \underline{a}_{NL,train}^{(s)(3)}(i)|^2; \quad (33)$$

$$m = 1, 2, \ldots, M_c,$$

where the parameter $\lambda$ reflects the forgetting factor; $0 < \lambda \leq 1$. By way of further example, the desired value of the filter coefficient vector can be computed in a recursive manner with the following set of expressions:

$$\underline{k}(n) = \frac{\lambda^{-1} \cdot P(n-1) \cdot \underline{a}_{NL,train}^{(s)(3)}(i)}{1 + \lambda^{-1} \cdot (\underline{a}_{NL,train}^{(s)(3)}(i))^H \cdot P(n-1) \cdot \underline{a}_{NL,train}^{(s)(3)}(i)} \quad (34)$$

$$\alpha(n) = x_{m,train}(n) - \underline{h}_m^T(n-1) \cdot \underline{a}_{NL,train}^{(s)(3)}(n) \quad (35)$$

$$\underline{h}_m(n) = \underline{h}_m(n-1) + \underline{k}(n) * \alpha^*(n) \quad (36)$$

$$P(n) = \lambda^{-1} \cdot P(n-1) - \lambda^{-1} \cdot \underline{k}(n) \cdot (\underline{a}_{NL,train}^{(s)(3)}(i))^H \cdot P(n-1) \quad (37)$$

Further, the receivers participating in the training need only be specialized in the sense of having the capability to provide feedback to the gateway. More specifically, the receivers may be single-carrier receivers that demodulate their own data only and do not require tuning to the other $M_c-1$ carrier frequencies involved in the multicarrier predistortion. Further, this process of estimation can be done offline, using dedicated servers afforded at the gateway, whenever a change in the input backoff level of the TWTA needs adjustment. It can also be repeated at a slow rate to track long-term variations in the transponder characteristics.

Figure 7A:
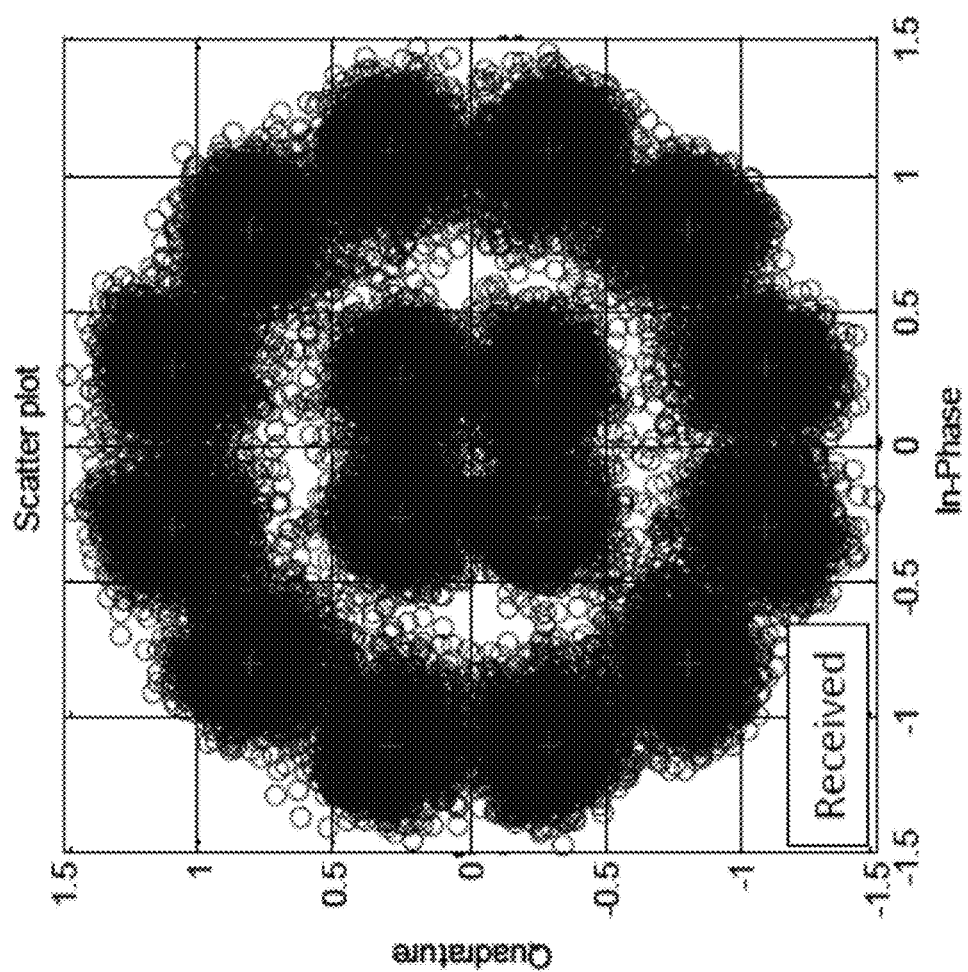
FIGS. 7A and 7B illustrate noiseless scattered diagrams comparing the desired received signal versus its reconstruction using the Volterra-based method.
Figure 7B:
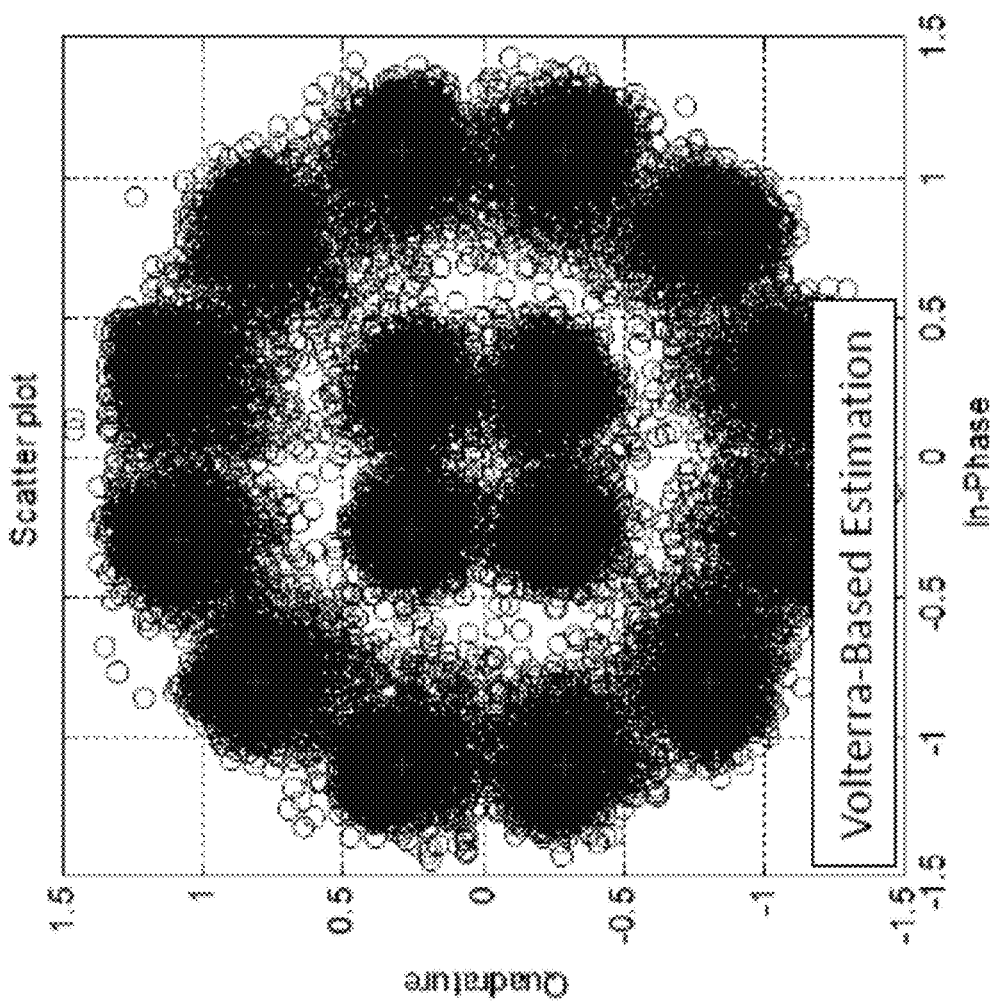

Further, in providing the distortion estimate $\underline{\mathcal{H}}_{m_d}(\underline{a}^{(s)})$ needed for the multicarrier PD, the accuracy of the Volterra-based implementation can be demonstrated as follows. For example, the multicarrier system model shown in FIG. 3 can be used with $M_c=4$, $\Delta f=40$ MHz, $R_S=37$Mbaud and root-raised cosine (RRC) filters of rolloff=0.1. The IMUX/OMUX filter responses and TWTA characteristics are as shown in FIGS. 5A-5F. FIGS. 7A and 7B illustrate noiseless scattered diagrams comparing the desired received signal versus its reconstruction using the Volterra-based method. The scatter-plots are as measured at the output of the Volterra filter, shown for the second carrier in the four-carrier composite, in the absence of AWGN, but including the IMD seen at that carrier receiver. The Volterra filter incorporates nonlinear terms up to the 3rd-order, with its coefficients computed using the adaptation technique described above. The plots confirm that the Volterra filter can perform excellent reconstruction of the nonlinear distortion, yielding an mean-squared-error (MSE) close to −32 dB between the desired received signal and its reconstructed version.

Figure 8:
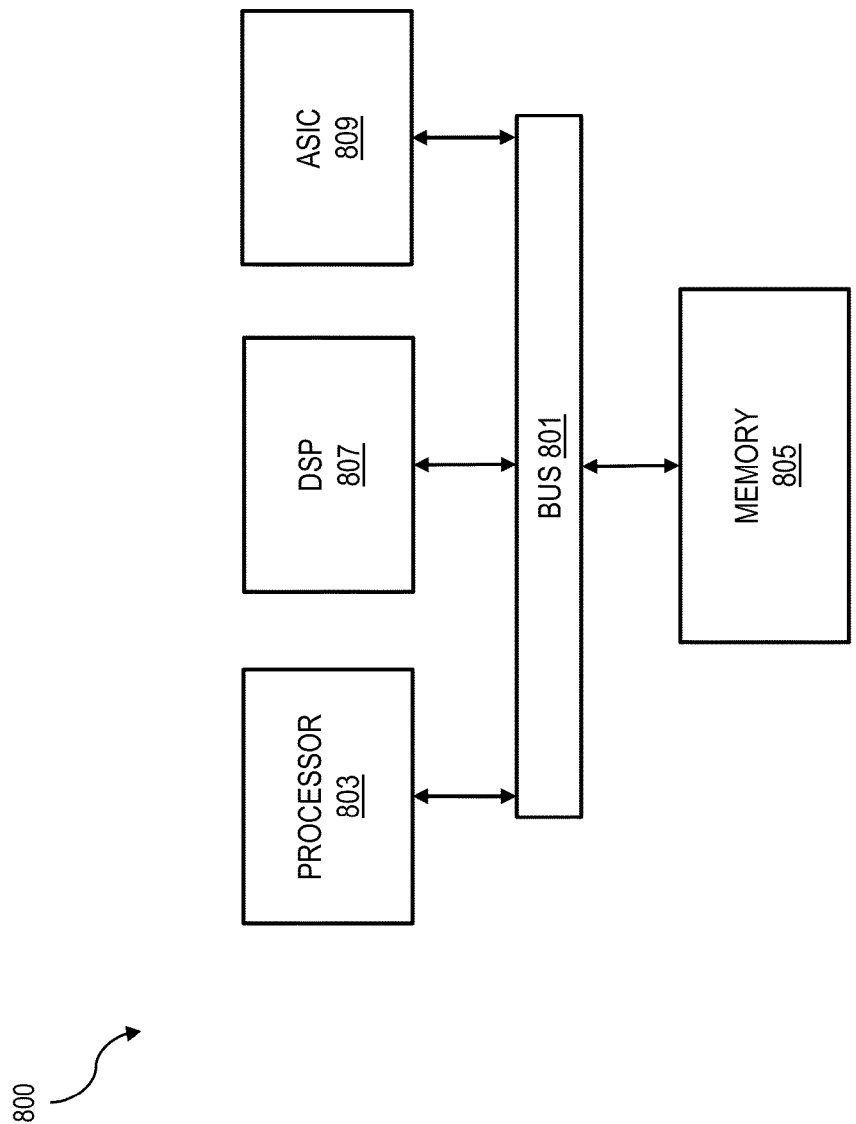
FIG. 8 illustrates a block diagram of a chip set that can be utilized in implementing example embodiments according to the present invention.

FIG. 8 illustrates a block diagram of a chip set that can be utilized in implementing example embodiments according to the present invention. Chip set 800 includes, for instance, processor and memory components described with respect to FIG. 8 incorporated in one or more physical packages. By way of example, a physical package includes an arrangement of one or more materials, components, and/or wires on a structural assembly (e.g., a baseboard or printed circuit board) to provide one or more characteristics such as physical strength, conservation of size, and/or limitation of electrical interaction.

In one embodiment, the chip set 800 includes a communication mechanism such as a bus 801 for passing information among the components of the chip set 800. A processor 803 has connectivity to the bus 801 to execute instructions/programs and process information stored in, for example, a memory 805. The processor 803 may include one or more processing cores with each core configured to perform independently. A multi-core processor enables multiprocessing within a single physical package, such as two, four, eight, or greater numbers of processing cores. Alternatively or in addition, the processor 803 may include one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, and/or one or more application-specific integrated circuits (ASIC) 809. A DSP 807 typically is configured to process real-time signals (e.g., sound or video) in real time independently of the processor 803. Similarly, an ASIC 809 can be configured to performed specialized functions not easily performed by a general purpose processor. Other specialized components to aid in performing the inventive functions described herein may include one or more field programmable gate arrays (FPGA) (not shown), one or more controllers (not shown), or one or more other special-purpose computer chips.

The processor 803 and accompanying components have connectivity to the memory 805 via the bus 801. The memory 805 may include both dynamic memory (e.g., RAM) and static memory (e.g., ROM) for storing executable instructions that, when executed by the processor 803 and/or the DSP 807 and/or the ASIC 809, perform the process of example embodiments as described herein. The memory 805 may also store the data associated with or generated by the execution of the process.

Further, the functionality of the example embodiments of the present invention may be provided by the chip set 800, in response to the processor 803 executing an arrangement of program instructions contained in memory 805. Execution of the program instructions contained in memory 805 causes the processor 803 to perform the process steps and generate the results described herein, or equivalents thereof. One or more processors in a multi-processing arrangement can also be employed to execute the program instructions. In alternative embodiments, hard-wired circuitry can be used in place of or in combination with software instructions to implement the example embodiments. Thus, embodiments of the present invention are not limited to any specific combination of hardware circuitry and software.

While example embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
   receiving a plurality of source signals, wherein each source signal comprises a sequence of source data symbols;
   encoding and modulating each source signal for transmission via a multicarrier channel of a wireless communications system;
   generating a final predistorted version for each encoded and modulated source signal;
   applying a transmit filter to the final predistorted version of each of the source signals;
   translating each of the filtered signals to a respective carrier frequency; and
   combining the translated signals to generate a composite signal for transmission via the multicarrier channel;
   wherein the final predistorted version for each of the encoded and modulated source signals is generated via an iterative process of a number of stages, wherein, for a given stage and for each source signal, the process comprises:
   receiving a respective prior predistorted version of each of the source signals from a preceding stage; and
   processing the prior predistorted version of the source signal based on the received prior predistorted versions of all of the source signals from the preceding stage, such that, at each stage, the processing of the prior predistorted version of each source signal takes into account the prior predistorted versions of all the encoded and modulated source signals from the preceding stage, wherein the processing of the prior predistorted version of the source signal is performed based on a characterization of one or more characteristics of the multicarrier channel.

2. The method according to claim 1, wherein the processing of the prior predistorted version of the source signal based on the received prior predistorted versions of all the encoded and modulated source signals from the preceding stage comprises determining a distortion estimate that would result from passing the composite signal through the multicarrier channel, and generating an error signal based on the distortion estimate.

3. The method according to claim 2, wherein the error signal is driven towards zero by applying the estimation via the iterative process.

4. The method according to claim 1, wherein, for each source signal and for the given stage of the iterative process for the generation of the final predistorted version for each of the encoded and modulated source signals:
   the predistorted version of each of the source signals from the preceding stage is represented as a vector of data symbols associated with the respective carrier frequency;
   a further predistorted version of the source signal is generated by applying an estimated predistortion, based on a distortion estimate that would result from passing the composite signal through the multicarrier channel, to the vector representation for the source signal; and
   the further predistorted versions of all of the source signals are fed-back for processing via the next stage.

5. The method according to claim 4, wherein the distortion estimate is represented as a vector based on a vector representation of the further predistorted versions for each of the source signals, and the distortion estimate is used to generate an error vector for the source signal relative to an undistorted version of the encoded and modulated source signal.

6. The method according to claim 5, wherein the error vector for the source signal is generated by subtracting the distortion estimate vector from the undistorted version of the encoded and modulated source signal.

7. The method according to claim 6, wherein the error vector for the source signal is driven towards zero by the iterative predistortion process.

8. The method according to claim 1, wherein for each source signal and for the given stage of the iterative process for the generation of the final predistorted version for each of the encoded and modulated source signals:

the predistorted version of each of the source signals from the preceding stage is represented as a vector of data symbols associated with the respective carrier frequency;

a further predistorted version of the source signal is generated by modifying the vector of data symbols (representing the predistorted version of the source signal from the preceding stage) based on a correction term, wherein the correction term is proportional to an error vector (representing an estimated predistortion based on a distortion estimate that would result from passing the composite signal through the multicarrier channel);

the further predistorted versions of all of the source signals are fed-back for processing via the next stage.

9. The method according to claim 8, wherein the modification of the vector of data symbols (representing the predistorted version of the source signal from the preceding stage) based on the correction term comprises:

processing the error vector (representing the estimated predistortion based on the distortion estimate that would result from passing the composite signal through the multicarrier channel) based on a step-size sequence to generate a modified error vector; and adding the modified error vector to the vector of data symbols (representing the predistorted version of the source signal from the preceding stage) to generate the further predistorted version of the source signal.

10. The method according to claim 9, wherein the step size sequence is defined to be positive and decreasing to drive the error vector towards zero.

11. The method according to claim 9, wherein the step-size sequence serves to optimize performance of the predistortion process by maximizing convergence speed (reduction of the number of predistorter stages) while minimizing residual error.

12. A transmitter apparatus comprising:

a receiver interface configured to receive a plurality of source signals, wherein each source signal comprises a sequence of source data symbols;

an encoder and a modulator configured to encode and modulate each source signal for transmission via a multicarrier channel of a wireless communications system;

a processor configured to generate a final predistorted version for each encoded and modulated source signal;

a transmit filter configured to filter to the final predistorted version of each of the source signals;

a signal processor configured to translate each of the filtered signals to a respective carrier frequency; and a signal combiner configured to combine the translated signals to generate a composite signal for transmission via the multicarrier channel;

wherein the processor is configured to generate the final predistorted version for each encoded and modulated source signal via an iterative process of a number of stages, wherein, for a given stage and for each source signal, the process comprises:

receiving a respective prior predistorted version of each of the source signals from a preceding stage; and processing the prior predistorted version of the source signal based on the received prior predistorted versions of all of the source signals from the preceding stage, such that, at each stage, the processing of the prior predistorted version of each source signal takes into account the prior predistorted versions of all the encoded and modulated source signals from the preceding stage, wherein the processing of the prior predistorted version of the source signal is performed based on a characterization of one or more characteristics of the multicarrier channel.

13. The apparatus according to claim 12, wherein the processing of the prior predistorted version of the source signal based on the received prior predistorted versions of all the encoded and modulated source signals from the preceding stage comprises determining a distortion estimate that would result from passing the composite signal through the multicarrier channel, and generating an error signal based on the distortion estimate.

14. The apparatus according to claim 13, wherein the error signal is driven towards zero by applying the estimation via the iterative process.

15. The apparatus according to claim 12, wherein, for each source signal and for the given stage of the iterative process for the generation of the final predistorted version for each of the encoded and modulated source signals:

the predistorted version of each of the source signals from the preceding stage is represented as a vector of data symbols associated with the respective carrier frequency;

a further predistorted version of the source signal is generated by applying an estimated predistortion, based on a distortion estimate that would result from passing the composite signal through the multicarrier channel, to the vector representation for the source signal; and the further predistorted versions of all of the source signals are fed-back for processing via the next stage.

16. The apparatus according to claim 15, wherein the distortion estimate is represented as a vector based on a vector representation of the further predistorted versions for each of the source signals, and the distortion estimate is used to generate an error vector for the source signal relative to an undistorted version of the encoded and modulated source signal.

17. The apparatus according to claim 16, wherein the error vector for the source signal is generated by subtracting the distortion estimate vector from the undistorted version of the encoded and modulated source signal.

18. The apparatus according to claim 17, wherein the error vector for the source signal is driven towards zero by the iterative predistortion process.

19. The apparatus according to claim 12, wherein for each source signal and for the given stage of the iterative process for the generation of the final predistorted version for each of the encoded and modulated source signals:

the predistorted version of each of the source signals from the preceding stage is represented as a vector of data symbols associated with the respective carrier frequency;

a further predistorted version of the source signal is generated by modifying the vector of data symbols (representing the predistorted version of the source signal from the preceding stage) based on a correction term, wherein the correction term is proportional to an error vector (representing an estimated predistortion based on a distortion estimate that would result from passing the composite signal through the multicarrier channel);

the further predistorted versions of all of the source signals are fed-back for processing via the next stage.

20. The apparatus according to claim 19, wherein the modification of the vector of data symbols (representing the predistorted version of the source signal from the preceding stage) based on the correction term comprises:

processing the error vector (representing the estimated predistortion based on the distortion estimate that would result from passing the composite signal through the multicarrier channel) based on a step-size sequence to generate a modified error vector; and adding the modified error vector to the vector of data symbols (representing the predistorted version of the source signal from the preceding stage) to generate the further predistorted version of the source signal.

21. The apparatus according to claim 20, wherein the step size sequence is defined to be positive and decreasing to drive the error vector towards zero.

22. The apparatus according to claim 20, wherein the step-size sequence serves to optimize performance of the predistortion process by maximizing convergence speed (reduction of the number of predistorter stages) while minimizing residual error.

* * * * *